US012765331B2

(12) United States Patent
Liu et al.

(10) Patent No.: US 12,765,331 B2
(45) Date of Patent: Oct. 13, 2026

(54) PHOTORESIST AND FORMATION METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Jui-Hsiung Liu, Taipei City (TW); Yu-Fang Tseng, New Taipei City (TW); Pin-Chia Liao, Taoyuan City (TW); Burn Jeng Lin, Hsinchu City (TW); Tsai-Sheng Gau, Hsinchu City (TW); Po-Hsiung Chen, Taichung City (TW); Po-Wen Chiu, Hsinchu City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 642 days.

(21) Appl. No.: 18/361,361

(22) Filed: Jul. 28, 2023

(65) Prior Publication Data

US 2024/0112912 A1 Apr. 4, 2024

Related U.S. Application Data

(63) Continuation-in-part of application No. 18/314,566, filed on May 9, 2023.

(Continued)

(51) Int. Cl.

*H10P 76/20* (2026.01)
*G03F 7/004* (2006.01)

(Continued)

(52) U.S. Cl.

CPC ........ *H10P 76/2042* (2026.01); *G03F 7/0042* (2013.01); *G03F 7/2004* (2013.01); *H10P 50/73* (2026.01)

(58) Field of Classification Search

CPC ...... G03F 7/0043; G03F 7/027; G03F 7/0042; G03F 7/20; G03F 7/004; H01L 21/0274;

(Continued)

(56) References Cited

U.S. PATENT DOCUMENTS 8,764,995 B2 7/2014 Chang et al.
8,796,668 B2 8/2014 Huang et al.

(Continued)

OTHER PUBLICATIONS

Cardineau et al., "Photolithographic properties of tin-oxo clusters using extreme ultraviolet light (13.5 nm)", Microelectronic Engineering, vol. 127, 2014, pp. 44-50.

(Continued)

*Primary Examiner* — Mouloucoulaye Inoussa

(74) *Attorney, Agent, or Firm* — Birch, Stewart, Kolasch & Birch, LLP

(57) ABSTRACT

A method of manufacturing a semiconductor device includes the following steps. A photoresist layer is formed over a material layer on a substrate. The photoresist layer has a composition including a solvent and a first photo-active compound dissolved in the solvent. The first photo-active compound is represented by the following formula (A1) or formula (A2):

Formula (A1)

$Zr_{12}O_8(OH)_{14}(RCO_2)_{18}$; or

Formula (A2)

$Hf_6O_4(OH)_6(RCO_2)_{10}$.

(Continued)

205c

R in the formula (A1) and R in the formula (A2) each include one of the following formulae (1) to (6):

Formula (1)

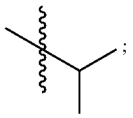

Formula (2)

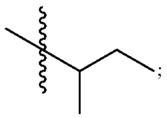

Formula (3)

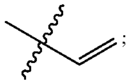

Formula (4)

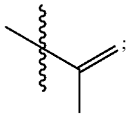

Formula (5)

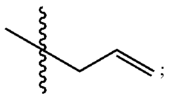

or

Formula (6)

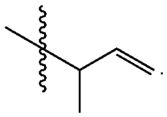

The photoresist layer is patterned. The material layer is etched using the photoresist layer as an etch mask.

20 Claims, 27 Drawing Sheets

Related U.S. Application Data

(60) Provisional application No. 63/401,896, filed on Aug. 29, 2022.

(51) Int. Cl.
*G03F 7/20* (2006.01)
*H10P 50/00* (2026.01)

(58) Field of Classification Search
CPC ............... H10D 62/822; H10D 30/797; H10D 84/0158; H10D 64/017; H10D 84/038; H10D 30/024; C07F 7/003; B01D 39/1623; B01D 46/0002; B01D 46/10; B01D 2239/0457; B01D 2239/0428; C12Q 1/6869; B82B 3/0076; B82B 3/0004; B01J 19/004; C08F 12/22; C08F 220/1811; C08F 212/22; C08F 220/281; C08F 220/283; C08F 212/24; C07C 59/70; C07C 41/26; C07C 43/23; C07D 233/16; C09D 133/066; C09D 125/18
See application file for complete search history.

(56) References Cited

U.S. PATENT DOCUMENTS

| | | | |
|---|---|---|---|
| 8,828,625 | B2 | 9/2014 | Lu et al. |
| 8,841,047 | B2 | 9/2014 | Yu et al. |
| 8,877,409 | B2 | 11/2014 | Hsu et al. |
| 8,945,803 | B2 | 2/2015 | Chen et al. |
| 8,987,689 | B2 | 3/2015 | Chen et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,184,054 | B1 | 11/2015 | Huang et al. |
| 9,213,234 | B2 | 12/2015 | Chang |
| 9,223,220 | B2 | 12/2015 | Chang |
| 9,256,123 | B2 | 2/2016 | Shih et al. |
| 9,256,133 | B2 | 2/2016 | Chang |
| 9,269,537 | B2 | 2/2016 | Tseng et al. |
| 9,305,799 | B2 | 4/2016 | Chen et al. |
| 9,338,993 | B2 | 5/2016 | Yu |
| 9,367,661 | B2 | 6/2016 | Jou et al. |
| 9,529,268 | B2 | 12/2016 | Chang et al. |
| 9,529,959 | B2 | 12/2016 | Wang et al. |
| 9,536,759 | B2 | 1/2017 | Yang et al. |
| 9,548,303 | B2 | 1/2017 | Lee et al. |
| 12,265,332 | B2 | 4/2025 | Lai et al. |
| 2009/0305437 | A1 | 12/2009 | Allemand et al. |
| 2015/0064612 | A1 | 3/2015 | Yamada et al. |
| 2015/0323869 | A1 | 11/2015 | Liu et al. |
| 2017/0269478 | A1 | 9/2017 | Lin et al. |
| 2020/0041897 | A1 | 2/2020 | Moon et al. |
| 2020/0073238 | A1 | 3/2020 | Zi et al. |
| 2020/0292937 | A1 | 9/2020 | Stowers et al. |
| 2021/0035798 | A1 | 2/2021 | Chen |
| 2021/0191261 | A1 | 6/2021 | Sue et al. |
| 2021/0238032 | A1 | 8/2021 | Stoughton et al. |
| 2021/0271166 | A1 | 9/2021 | Zi et al. |
| 2021/0302839 | A1 | 9/2021 | Liu et al. |
| 2021/0364922 | A1 | 11/2021 | Chen |
| 2023/0043143 | A1 | 2/2023 | Ushiyama et al. |
| 2023/0374338 | A1 | 11/2023 | Jilek et al. |
| 2024/0310731 | A1 | 9/2024 | Watabe et al. |

OTHER PUBLICATIONS

Castellanos et al., "Ti, Zr, and Hf-based molecular hybrid materials as EUV photoresists", Proceedings of SPIE, vol. 10583, 2018, pp. 105830A-1~105830A-12.

Krysak et al., "Investigation of novel inorganic resists materials for EUV lithography", SPIE Advanced Lithography, Proceedings of SPIE, vol. 9048, Extreme Ultraviolet (EUV) Lithography V, 2014, pp. 904805-1~904805-7.

Liao et al., "Partial Decarboxylation of Hafnium Oxide Clusters for High Resolution Lithographic Applications", Journal of Materials Chemistry C, 2022, pp. 1-9.

Wu et al., "Mechanistic insights in Zr- and Hf-based molecular hybrid EUV photoresists", Journal of Micro/Nanolithography, Microfabrication, and Microsystems, vol. 18, 2019, pp. 013504-1~013504-10.

$Hf_6O_4(OH)_4(RCO_2)_n(R'CO_2)_{12-n}H_2O$
$\bullet 3RCO_2H$

M'OH or $M'_2CO_3$

DCM/$H_2O$ $Hf_6O_4(OH)_8(RCO_2)_n(R'CO_2)_{8-n}$

Fig. 23

PHOTORESIST AND FORMATION METHOD THEREOF

RELATED APPLICATIONS

This application is a Continuation-in-part of U.S. application Ser. No. 18/314,566, filed on May 9, 2023, which claims priority to U.S. Provisional Patent Application Ser. No. 63/401,896, filed Aug. 29, 2022, which is herein incorporated by reference in its entirety.

BACKGROUND

As modern integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 23 is a general Reaction Scheme 2-3.

DETAILED DESCRIPTION

Figure 1A:
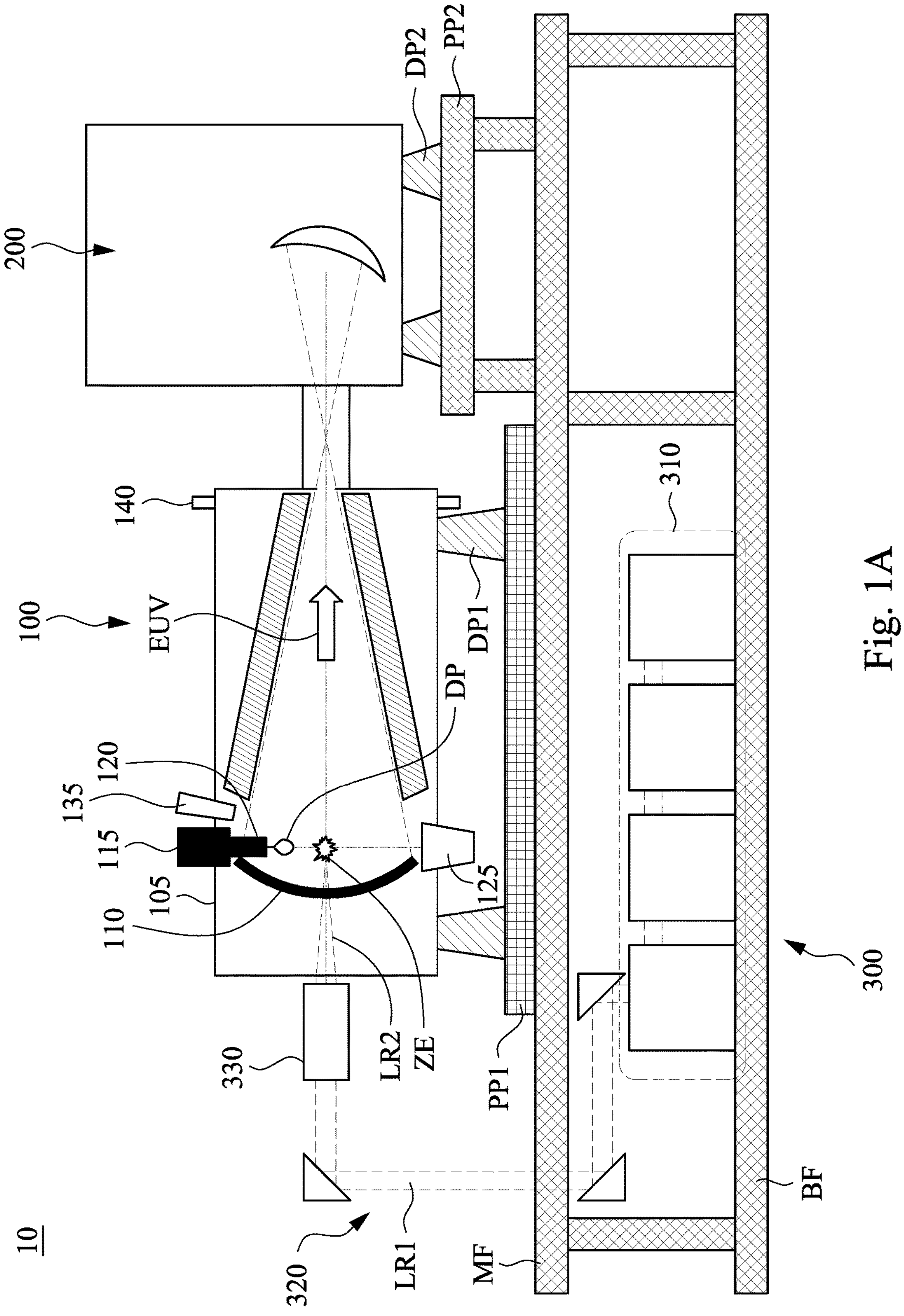
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s), or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view diagram of an EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by an EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example for 20 nanometer (nm) technology nodes. Metal oxide based photoresists; such as 12-tin-oxo cluster based coating materials, exhibit good absorption of far ultraviolet light at a 193 nm wavelength and extreme ultraviolet light at a 13.5 nm wavelength, being more efficient than organic polymers in EUV absorptions. Although metal oxide based photoresists have nice lithographic patterns, they are sensitive to water and air, and thus a rigorous lithography performed on the metal oxide photoresists is required.

The present disclosure provides a novel photoresist having a partially decarboxylated compound which is stable with air and water. The novel photoresist can be formed into a substantially large area with a smooth surface morphology. The various aspects of the present disclosure will be discussed below in greater detail with reference to FIGS. 1A-18. First, an EUV lithography system will be discussed below with reference to FIGS. 1A, 1B and 2. Next, the details of the novel photoresist and the lithography process employing the photoresist will be discussed with reference to FIGS. 3-18.

The advanced lithography process, method, and materials described in the current disclosure can be used in many applications, including fin-type field effect transistors (FinFETs), gate-all-around (GAA) FETs. For example, the fins may be patterned to produce a relatively close spacing between features, for which the above disclosure is well suited. In addition, spacers used in forming fins of FinFETs can be processed according to the above disclosure.

To address the trend of the Moore’s law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
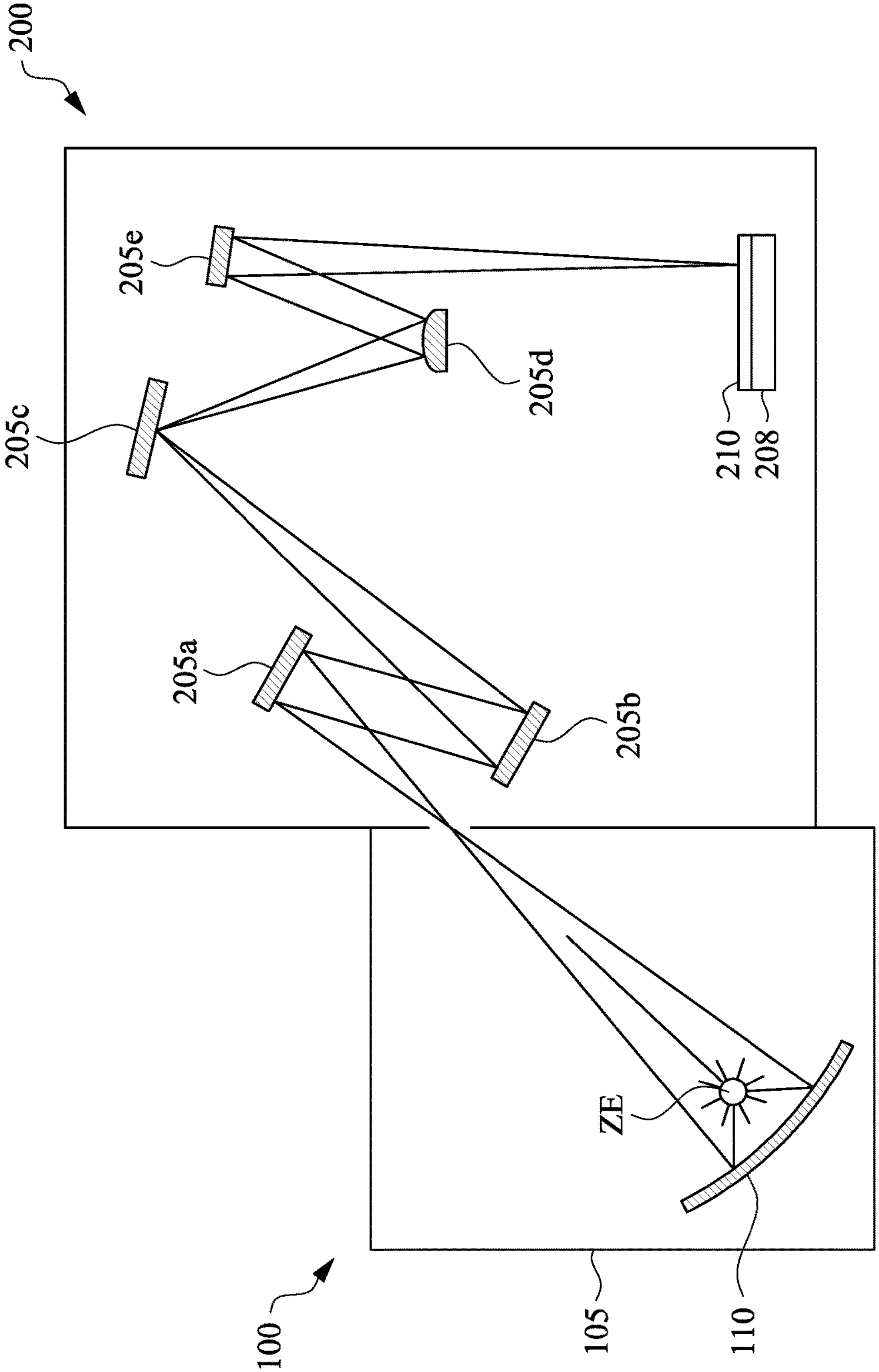
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength. In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide (CO2) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns; and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror; for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205*c* and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
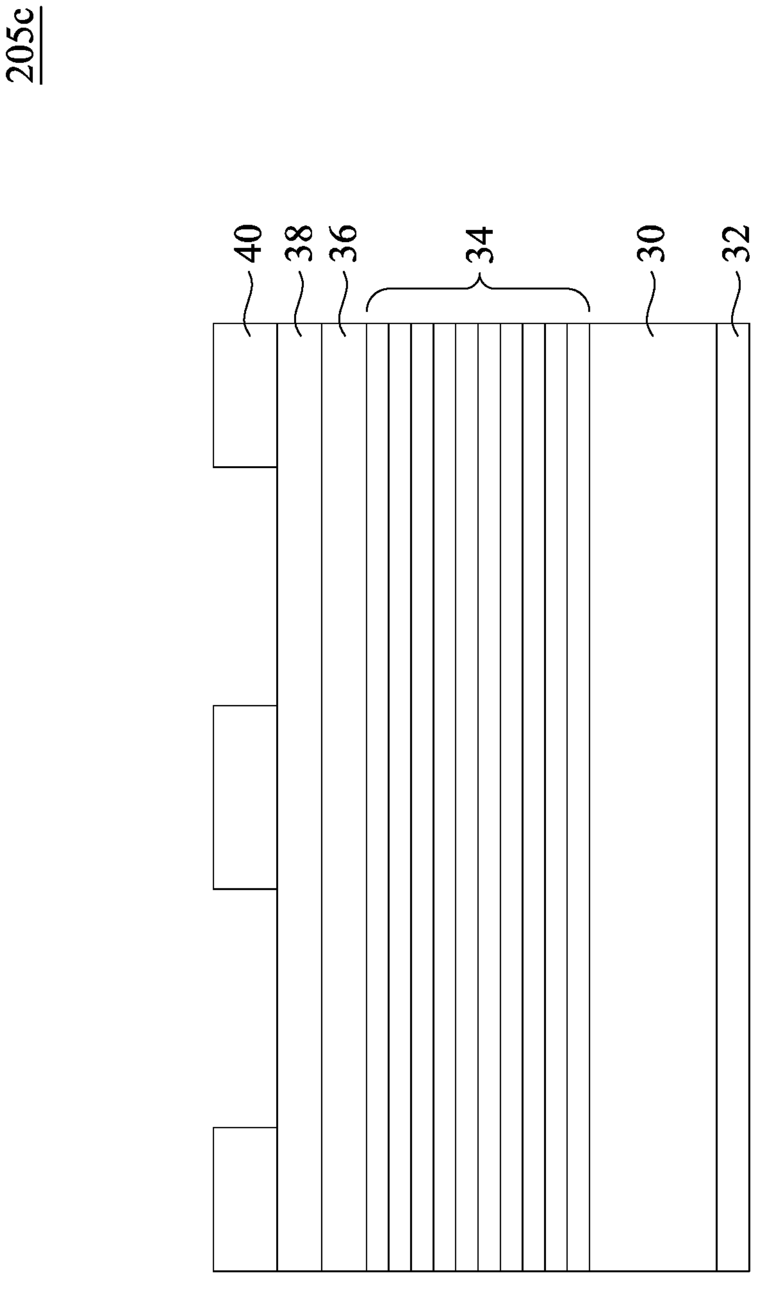
FIG. 2 is a sectional view of a EUV mask constructed in accordance with some embodiments of the present disclosure.

One example of the reflective mask 205*c* is shown in FIG. 2. The reflective mask 205*c* in the illustrated embodiment is a EUV mask, and includes a substrate 30 made of a LTEM. The LTEM material may include TiO2 doped SiO2, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205*c* includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205*c* also includes a capping layer 36 disposed over the ML structure 34 to prevent oxidation of the ML. The EUV mask 205*c* may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205*c* also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3, 5, 6 and 12 are diagrammatic fragmentary cross-sectional side views of a semiconductor device 45 at various stages of fabrication in accordance with various aspects of the present disclosure. The semiconductor device 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS-transistors, or other types of transistors.

Figure 3:
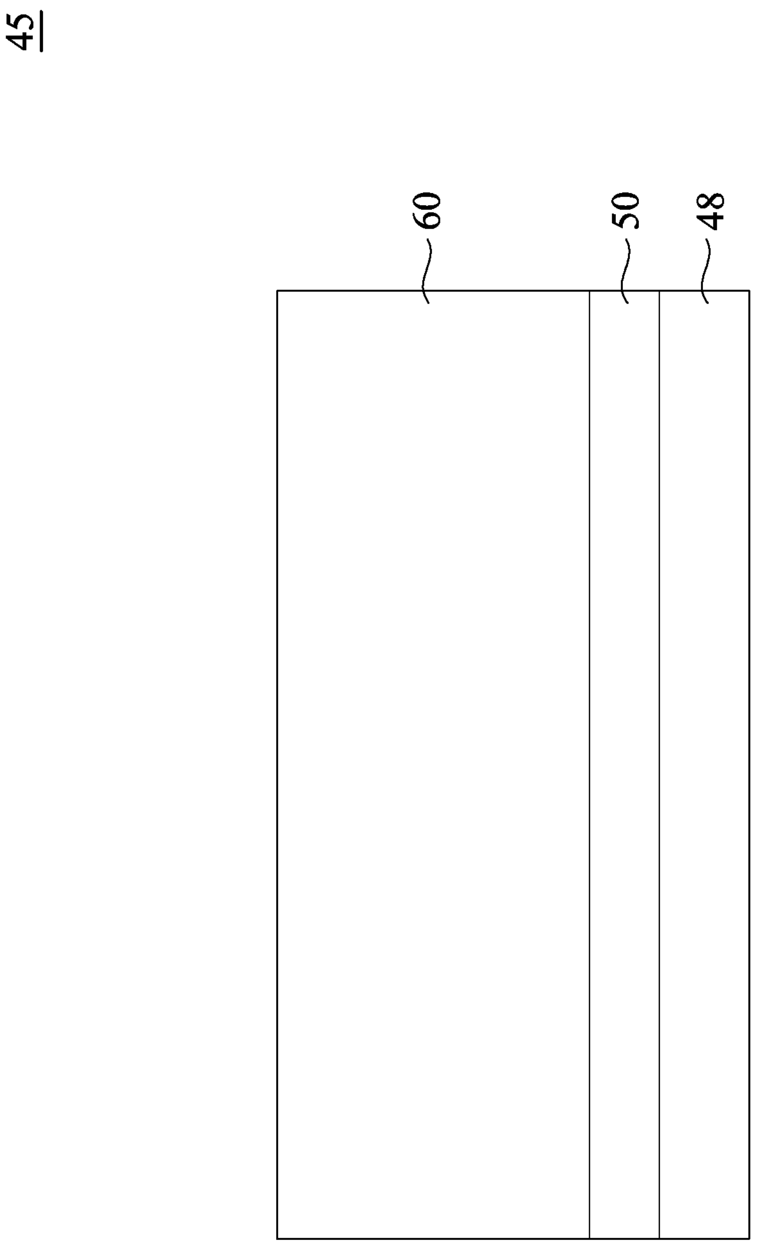
FIG. 3 is a diagrammatic fragmentary cross-sectional side view of a semiconductor device at various stages of fabrication in accordance with various aspects of the present disclosure.

Referring to FIG. 3, a semiconductor device 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond.

The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about 103 ohm-meter. In some embodiments, the substrate 48 contains metal, metal alloy, or metal nitride/sulfide/selenide/oxide/silicide with the formula MXa, where M is a metal, and X is N, S, Se, O, Si, and where “a” is in a range from about 0.4 to 2.5. For example, the substrate 48 may contain Ti, Al, Co, Ru, TiN, WN2, or TaN.

In some other embodiments, the substrate 48 contains a dielectric material with a dielectric constant in a range from about 1 to about 40. In some other embodiments, the substrate 48 contains Si, metal oxide, or metal nitride, where the formula is MXb, wherein M is a metal or Si, and X is N or O, and wherein “b” is in a range from about 0.4 to 2.5. For example, the substrate 48 may contain SiO2, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 and the overlying photoresist layer have different etching resistance. In some embodiments, the material layer 50 contains an etching resistant molecule. It is understood that the substrate 48 and the material layer 50 may each include additional suitable material compositions in other embodiments.

A photoresist layer 60 is formed over the material layer 50. The photoresist layer 60 may be formed by a spin-coating process. In some embodiments, the photoresist layer 60 can be spin coated on a 4-inch silicon wafer. A composition of the photoresist layer 60 is placed (dispensed) on the silicon wafer which is brought to a rotational speed of 1500±10 rpm (e.g., 1500 rpm) for 5 to 20 seconds, for example, 10 seconds, followed by 2000±10 rpm (e.g., 2000 rpm) for 20 to 30 seconds, for example, 25 seconds. The photoresist layer 60 is then baked at 60° C. to 90° C. for 60 to 70 seconds, for example, 60 seconds. In some embodiments, the photoresist layer 60 has a thickness in a range from 20 nm to 25 nm.

The photoresist layer 60 includes a solvent and one or more photo-active compounds dissolved in the solvent. The solvent includes an appropriate organic solvent for an adjustment of its viscosity. Such organic solvent includes, but is not limited to, 4-methyl-2-pentanol. The photo-active compounds are in an amount from 1.5 wt % to 2.0 wt % with respect to a weight of the photoresist layer 60.

The photoresist layer 60 may include a first photo-active compound in which the first photo-active compound is a metal oxide-containing compound. In some embodiments, the first photo-active compound is a 6. If-containing oxide, a 12 Zr-containing oxide, or a combination thereof. In other words, the first photo-active compound may be an oxide containing Zr or Hf. The first photo-active compound is a decarboxylated 6-Hf-oxo cluster, a decarboxylated 12-Zr-oxo cluster, or a combination thereof, and may be represented by the following formulae (A1) to (A2):

$Zr_{12}O_8(OH)_{14}(RCO_2)_{18}$ formula (A1); and formula (A1)

$Zr_{12}O_8(OH)_{14}(RCO_2)_{18}$; and formula (A2)

$Hf_6O_4(OH)_6(RCO_2)_{10}$.

Herein, illustrative examples of R in the above formulae (A1) to (A2) may be represented by the following formulae (1) to (6):

Formula (1)

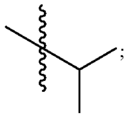

;

Formula (2)

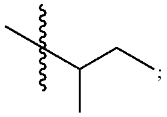

;

Formula (3)

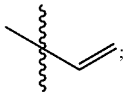

;

Formula (4)

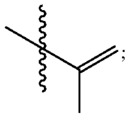

;

Formula (5)

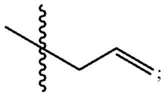

; and

Formula (6)

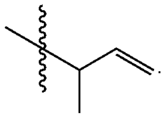

.

The first photo-active compound can allow the photoresist layer 60 to be formed into a substantially large area with a smooth surface morphology. The first photo-active compound is beneficial for the photoresist layer 60 exhibiting an improved contrast at a low exposure dose of the EUV radiation after being patterned, leading to an improvement of resolution of margin of hole or trench patterns in the material layer 50.

In some embodiments, the first photo-active compound may be prepared by performing a partial decarboxylation reaction to a second photo-active compound using a strong base in which the second photo-active compound is stable with water and air. For example, the second photo-active compound may be an oxide containing Zr or Hf and may be represented by the following formulae (B1) to (B2):

Formula (B1)

$Zr_{12}O_8(OH)_8(RCO_2)_{24}$; and $\bullet 6RCO_2H$

Fomula (B2)

$Hf_6O_4(OH)_4(RCO_2)_{12}H_2O$.

$\bullet 3RCO_2H$

The first photo-active compound has a better quality than the second photo-active compound at least in terms of the surface roughness, a line width roughness (LWR) and a critical dimension uniformity (CDU). In some embodiments, the first photo-active compound is synthesized by a plurality of steps such as a first reaction and followed by a second reaction. The first reaction is to react $M(OBu)_4$ with a first compound C1 and a second compound C2 as shown in a general reaction scheme 1-1 and a general reaction scheme 1-2 below to form the second photo-active compound having the formulae (B1) to (B2) as discussed above:

Reaction Scheme 1-1

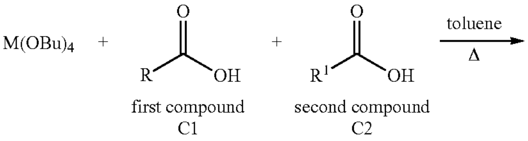

$Zr_{12}O_8(OH)_8(RCO_2)_{24}$;

$\bullet 6RCO_2H$

Reaction Scheme 1-2

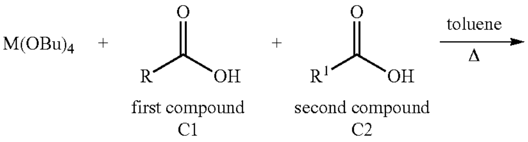

$Hf_6O_4(OH)_4(RCO_2)_{12}H_2O$, $\bullet 3RCO_2H$ which M is Zr in the reaction scheme 1-1 and M is Hf in the reaction scheme 1-2, R and $R^1$ may be one of the formulae (1) to (6) as discussed above. Each of the first compound C1 and the second compound C2 includes a carboxylic acid group. In some embodiments, R of the first compound C1 and $R^1$ of the second compound C2 are the same. In other words, the first compound C1 and the second compound C2 have the same formula. In some other embodiments, R of the first compound C1 and $R^1$ of the second compound C2 are different from each other. In other words, the first compound C1 and the second compound C2 have the different formulae.

For example, illustrative examples of the first compound C1 and the second compound C2 may be represented by the following formulae (C1-a) to (C2-a), respectively:

Formula (C1-a)

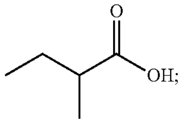

and

Formula (C2-a)

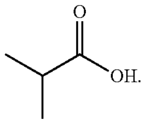

In some embodiments, illustrative examples of the first compound C1 and the second compound C2 may be represented by the following formulae (C1-b) to (C2-b), respectively:

Formula (C1-b)

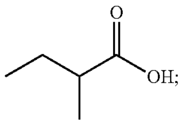

and

Formula (C2-b)

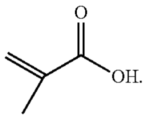

In some embodiments, illustrative examples of the first compound C1 and the second compound C2 may be represented by the following formulae (C1-c) to (C2-c), respectively:

Formula (C1-c)

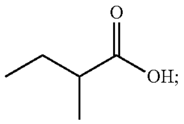

and

Formula (C2-c)

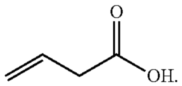

In some embodiments, illustrative examples of the first compound C1 and the second compound C2 may be represented by the following formulae (C1-d) to (C2-d), respectively:

Formula (C1-d)

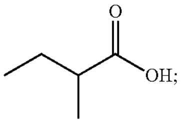

and

Formula (C2-d)

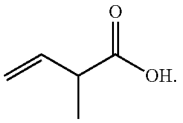

In some embodiments, illustrative examples of the first compound C1 and the second compound C2 may be represented by the following formulae (C1-e) to (C2-e), respectively:

Formula (C1-e)

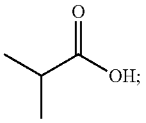

and

Formula (C2-e)

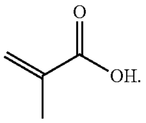

In some embodiments, illustrative examples of the first compound C1 and the second compound C2 may be represented by the following formulae (C1-f) to (C2-f), respectively:

Formula (C1-f)

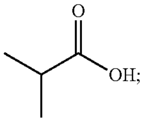

and

Formula (C2-f)

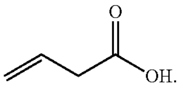

In some embodiments, illustrative examples of the first compound C1 and the second compound C2 may be represented by the following formulae (C1-g) to (C2-g), respectively:

Formula (C1-g)

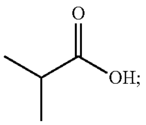

and

Formula (C2-g)

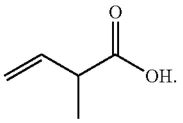

An example of the appropriate solvent for the first reaction (i.e., the reaction schemes 1-1 and 1-2) is toluene. A reaction temperature of the first reaction (i.e., the reaction schemes 1-1 and 1-2) may be held at an elevated temperature from 50° C. to 60° C., such as 55° C. in some embodiments for 10 hours to 14 hours, such as 12 hours.

The second reaction is a partial decarboxylation reaction. For example, the second reaction is to react a product obtained from the first reaction with one or more strong bases as shown in the general reaction schemes 2-1 and 2-2 below in a dichloromethane (DCM) and/or $H_2O$ to form the first photo-active compound having the formulae (A1) to (A2) as discussed above:

Reaction Scheme 2-1

$$Zr_{12}O_8(OH)_8(RCO_2)_{24} \cdot 6RCO_2H \xrightarrow[DCM/H_2O]{M'OH \text{ or } M'_2CO_3} Zr_{12}O_8(OH)_{14}(RCO_2)_{18};$$

Reaction Scheme 2-2

$$Hf_6O_4(OH)_4(RCO_2)_{12}H_2O \cdot 3RCO_2H \xrightarrow[DCM/H_2O]{M'OH \text{ or } M'_2CO_3} Hf_6O_4(OH)_6(RCO_2)_{10}.$$

The strong base is M'OH or $M'_2CO_3$, in which M' is Li, Na, K, Rb, Cs or $R_4N$, and R of $R_4N$ may be an alkyl group having 1 to 4 carbon atoms.

A mechanism of the partial decarboxylation reaction can be shown in general reaction schemes 3-1 and 3-2 below:

Reaction Scheme 3-1

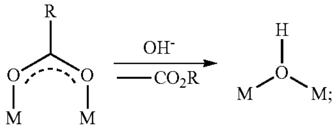

Reaction Scheme 3-2

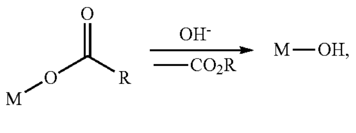

in which M is Zr or Hf in the reaction schemes 3-1 and 3-2, and R in the reaction schemes 3-1 and 3-2 may be one of the formulae (1) to (6) as discussed above. In the reaction schemes 3-1 and 3-2, the strong base (i.e., $OH^-$) can remove the carboxylate ligand (i.e., —$CO_2R$). In other words, the $OH^-$ group from the strong base can replace the carboxylate ligand. Therefore, as compared to the "M" in the reactant before the partial decarboxylation reaction, a density of the "M" in the product of the partial decarboxylation reaction is increased, and an intermolecular distance of the "M" in the product of the partial decarboxylation reaction is reduced. That is, in the reaction schemes 2-1 and 2-2, the Zr and the Hf in the first photo-active compound having the formulae (A1) and (A2), respectively, have an increased density and a reduced intermolecular distance. This provides the photoresist layer 60 with a smooth surface, having a high quality after undergoing a lithography process, and a low exposure dose of the EUV radiation required to expose the photoresist layer 60. The photoresist layer 60 can be patterned to have a half-pinch (HP) of 17 nm to 22 nm, such as 17 nm, with 40 mj/$cm^2$ to 200 mj/$cm^2$, such as 100 mj/$cm^2$ to 200 mj/$cm^2$ by a subsequent lithography process. In some embodiments, the photoresist layer 60 may include another photo-active compound (e.g, the third photo-active compound) different from the first photo-active compound to achieve the half-pinch (HP) of 17 nm to 22 nm, such as 17 nm, with 50 mj/$cm^2$ to 80 mj/$cm^2$ by a subsequent lithography process.

In some embodiments where the second photo-active compound represented by the formulae (B1) or (B2), the illustrative example of "$RCO_2$" in the formulae (B1) or (B2) may be represented by the following formula (D1):

Formula (D1)

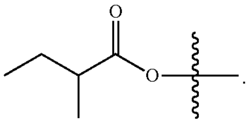

($C_5H_9O_2$) or ($C_4H_9CO_2$)

The first photo-active compound can be obtained by the partial decarboxylation reaction of the second photo-active compound and may be represented by the following formulae (A1-1) to (A2-1), respectively:

$$Zr_{12}O_8(OH)_{14}(C_4H_9CO_2)_{18}; \text{ and} \quad (A1\text{-}1)$$

$$Hf_6O_4(OH)_6(C_4H_9CO_2)_{10}. \quad (A2\text{-}1)$$

In some embodiments where the photoresist layer 60 includes the first photo-active compound having the formulae (A2-1), the photoresist layer 60 can be formed into a smooth film over a large area, such as an area having a length of 500 μm to 700 μm, such as 600 μm and a width of 400 μm to 600 μm, such as 500 μm. In some embodiments, the surface of the photoresist layer 60 with a thickness of 22.12±5 nm formed on an area having a square geometry with a dimension of 4 μm to 6 μm, such as 5 μm, may have a surface roughness ($R_{rms}$) of 0.8 nm to 0.9 nm, such as 0.85 nm measured by means of an atomic force microscope (AFM). In some embodiments where the photoresist layer 60 is formed on a domain having a length of 2 μm to 4 μm, such as 3 μm and a width of 3 μm to 5 μm, such as 4 μm, the photoresist layer 60 undergone an EUV exposure of 200±5 mJ/$cm^2$ shows no defects.

An element analysis (EA) data and a thermogravimetric analysis (TGA) data of the product of the partial decarboxylation reaction of the second photo-active compound in which R in the formulae (B1) and (B2) is "$C_4H_9CO_2$" ensure the product having the formulae (A1-1) and (A2-1), respectively. A result of the EA is shown in the following Table-1 and Table-2 in which "C" represents carbon, and "H" represents hydrogen.

TABLE 1

| ELEMENT | MEASUREMENT VALUE | CALCULATION VALUE ($Zr_{12}O_8(OH)_{14}(C_4H_9CO_2)_{18}$) |
|---|---|---|
| C | 33.64 (±0.1) | 32.95 (±0.1) |
| H | 5.62 (±0.1) | 5.41 (±0.1) |

TABLE 2

| ELEMENT | MEASUREMENT VALUE | CALCULATION VALUE ($Hf_6O_4(OH)_6(C_4H_9CO_2)_{10}$) |
|---|---|---|
| C | 26.50 (±0.1) | 26.71 (±0.1) |
| H | 4.36 (±0.1) | 4.30 (±0.1) |

The table-1 and table-2 show the facts that the measurement values and the corresponding calculation values are substantially the same. In other words, the product of the partial decarboxylation reaction of the second photo-active compound has the formulae $Zr_{12}O_8(OH)_{14}(C_4H_9CO_2)_{18}$ and $Hf_6O_4(OH)_6(C_4H_9CO_2)_{10}$, which are the formulae (A1-1) and (A1-2) of the first photo-active compound.

Figure 4B:
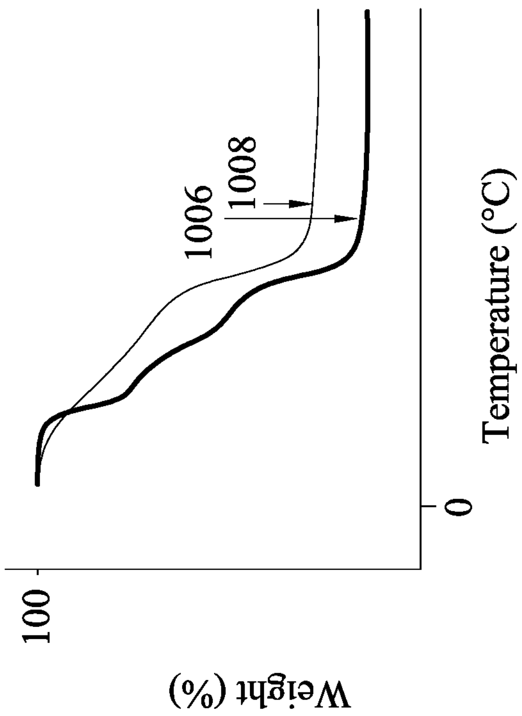
FIG. 4B is a thermogravimetric analysis (TGA) of the second photo-active compound having the formula (B2) in which R in the formula (B2) is "C4H9CO2" and the product of the partial decarboxylation reaction thereof in accordance with some embodiments.
Figure 4A:
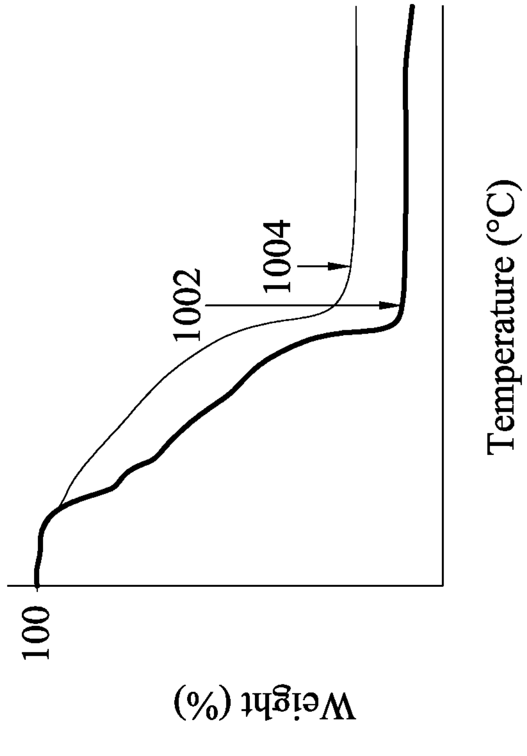
FIG. 4A is a thermogravimetric analysis (TGA) of the second photo-active compound having the formula (B1) in which R in the formula (B1) is "C4H9CO2" and of the product of the partial decarboxylation reaction thereof in accordance with some embodiments.

FIG. 4A is a thermogravimetric analysis (TGA) of the second photo-active compound having the formula (B1) in which R in the formula (B1) is "$C_4H_9CO_2$" and of the product of the partial decarboxylation reaction thereof in accordance with some embodiments. A curve 1002 shows the TGA of the second photo-active compound having the formula (B1) in which R in the formula (B1) is "$C_4H_9CO_2$", and a curve 1004 shows the TGA of the product of the partial decarboxylation reaction thereof. The curve 1000 shows a mass remainder of about 36.7±0.1% between about 400° C. and about 405° C., such as 401.2° C., which is $ZrO_2$. The corresponding calculation value of the $ZrO_2$ is 33.6±0.1%, which is substantially the same as the mass remainder of TGA. The curve 1002 shows a mass remainder of about 45.6±0.1% between about 460° C. and about 470° C., such as 468.3° C. The corresponding calculation value of the $ZrO_2$ is 45.1±0.1%, which is substantially the same as the mass remainder of TGA.

FIG. 4B is a thermogravimetric analysis (TGA) of the second photo-active compound having the formula (B2) in which R in the formula (B2) is "$C_4H_9CO_2$" and the product of the partial decarboxylation reaction thereof in accordance with some embodiments. A curve 1006 shows the TGA of the second photo-active compound having the formula (B2) in which R in the formula (B2) is "$C_4H_9CO_2$", and a curve 1008 shows the TGA of the product of the partial decarboxylation reaction thereof. The curve 1006 shows a mass remainder of about 50.1±0.1% between about 455° C. and about 465° C., such as 461.7° C., which is $HfO_2$. The corresponding calculation value of the $HfO_2$ is46.1±0.1%, which is substantially the same as the mass remainder of TGA. The curve 1008 shows a mass remainder of about 57.5±0.1% between about 480° C. and about 490° C., such as 487.6° C. The corresponding calculation value of the $HfO_2$ is 56.0±0.1%, which is substantially the same as the mass remainder of TGA.

In some embodiments, the photoresist layer 60 includes more than one kind of photo-active compounds. For example, the photoresist layer 60 may include the first photo-active compound and a third photo-active compound different from the first photo-active compound dissolved in the solvent. The third photo-active compound may be an inorganic photo-active compound, an organic photo-active compound, or a combination thereof. In some embodiments, the third photo-active compound can be a 6Sn-2Cl oxide cluster. An illustrative example of the 6Sn-2Cl oxide cluster may be represented by the following formula (E1):

Formula (E1)

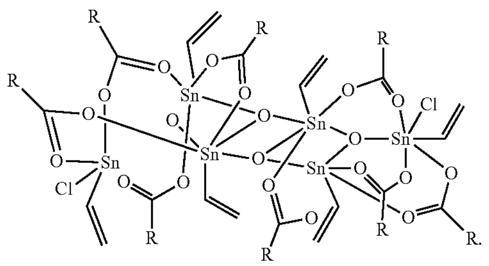

A weight ratio of the third photo-active compound to the first photo-active compound is from 0.1 to 10. R in the formula (E1) can be represented by the formulae (1) to (6) as discussed above. The third photo-active compound has a high sensitivity to the EUV radiation. Therefore, in some embodiments where the photoresist layer 60 includes the first photo-sensitive compound and the third photo-sensitive compound, the photoresist layer 60 can be patterned to have a half-pinch (HP) of 17±0.1 nm with 40 mj/$cm^2$ to 60 mj/$cm^2$ by a subsequent lithography process.

In some embodiments, the photoresist layer 60 may include the first photo-active compound and a fourth photo-active compound different from the first photo-active compound dissolved in the solvent. The fourth photo-active compound can be a 6Sn-drum oxide cluster. An illustrative example of the fourth photo-active compound may be represented by the following formula (F1):

Formula (F1)

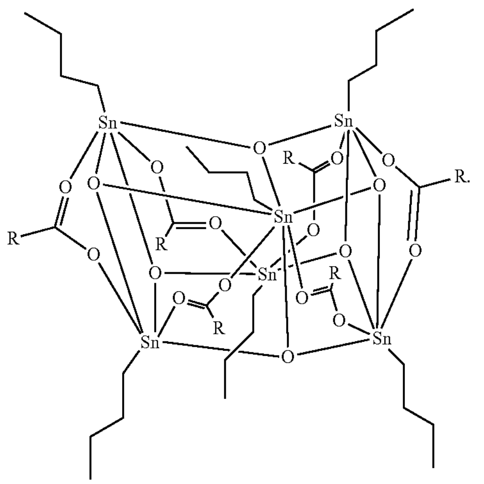

A weight ratio of the fourth photo-active compound to the first photo-active compound is from 0.1 to 10. R in the formula (F1) can be represented by the formulae (1) to (6) as discussed above.

Figure 5:
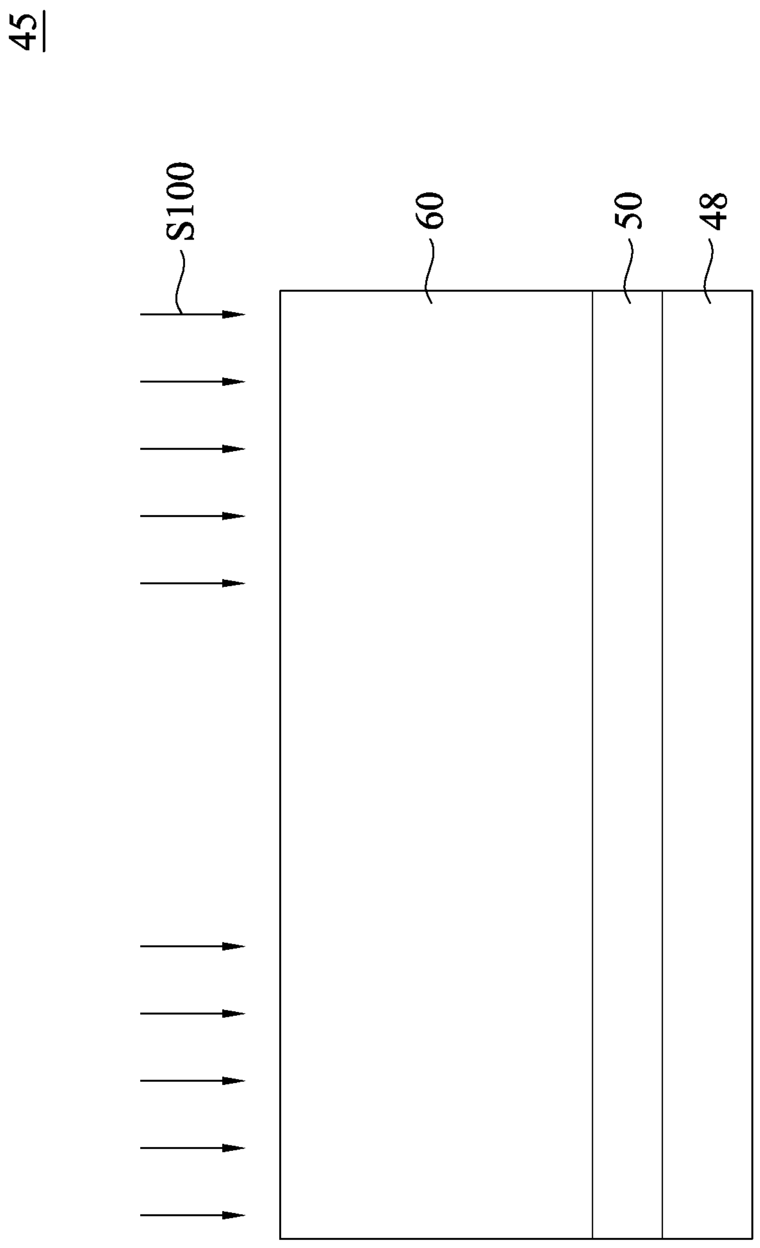
FIGS. 5 and 6 are diagrammatic fragmentary cross-sectional side views of a semiconductor device at various stages of fabrication in accordance with various aspects of the present disclosure.

Referring to FIG. 5, an exposure process S100 is performed to expose the photoresist layer 60 to an EUV radiation. The exposure process 300 applies the EUV radiation to an area of the photoresist layer 60. In some embodiments, the photoresist layer 60 can be patterned using a low dose of EUV radiation, for example, in a range from 40 $mJ/cm^2$ to 200 $mJ/cm^2$. After the photoresist layer 60 is exposed, the photoresist layer 60 is baked at 80° C. to 100° C. for 1 minute to 2 minutes, for example, 1 minute.

Figure 6:
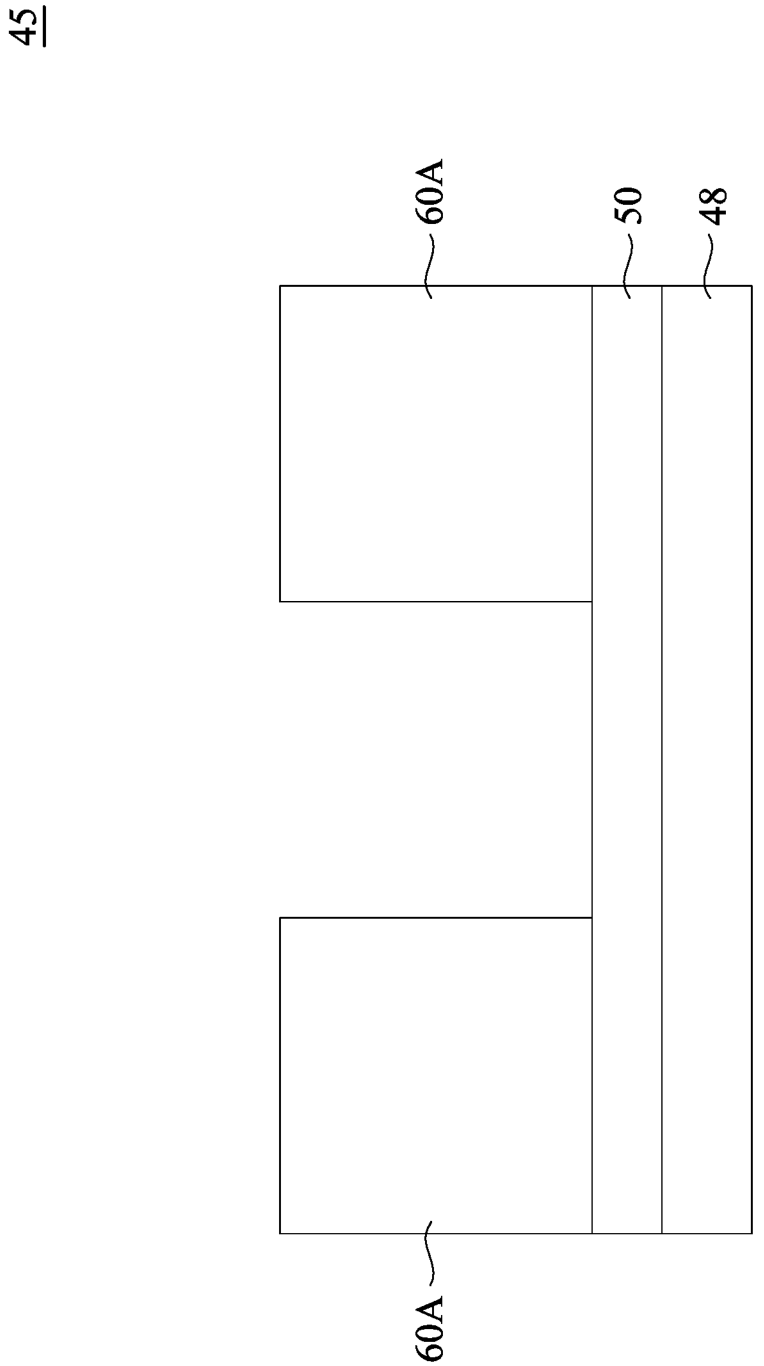

Referring now to FIG. 6, the exposed photoresist layer 60 is developed, forming patterned photoresists 60A separated by a recess. The exposed photoresist layer 60 is developed using 2-heptanone for 50 to 70 seconds, such as 60 seconds followed by being baked at 80° C. to 100° C.

Figure 7B:
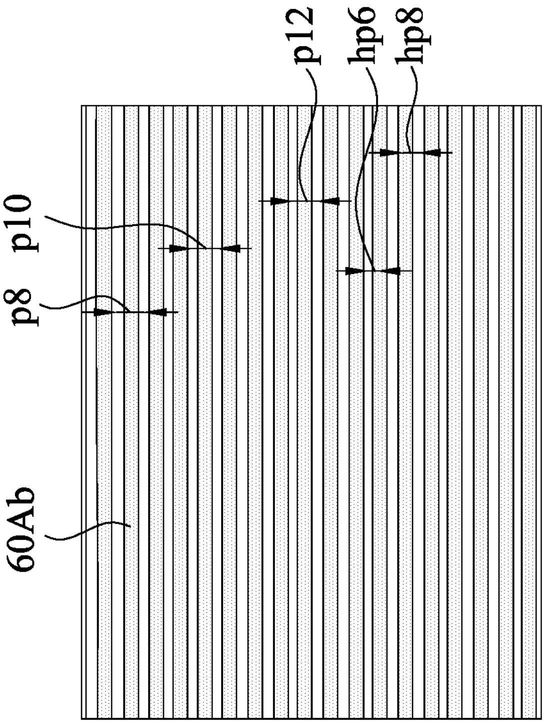
FIGS. 7A and 7B illustrate a top view of patterned photoresists with a half-pinch (HP) of 25±0.1 nm, and a top view of patterned photoresists with a half-pinch (HP) of 22±0.1 nm, respectively, that may be observed using a scanning electron microscope (SEM) in accordance with some embodiments.
Figure 7A:
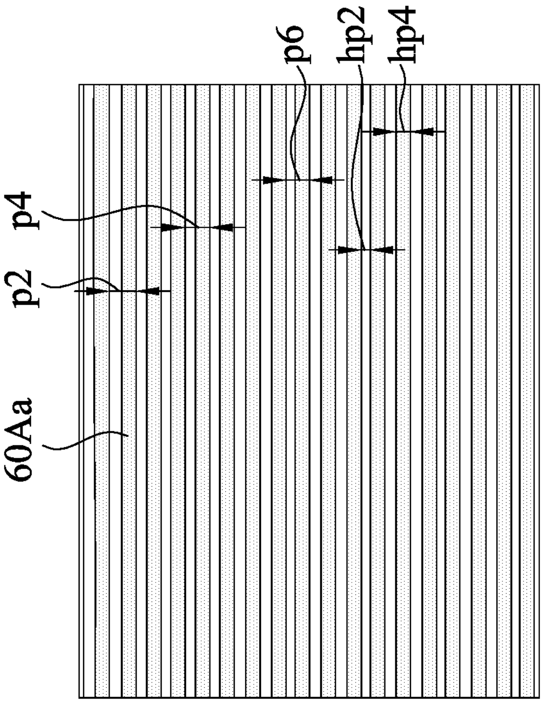

FIGS. 7A and 7B illustrate a top view of patterned photoresists 60Aa with a half-pinch (HP) of 25±0.1 nm, and a top view of patterned photoresists 60Ab with a half-pinch (HP) of 22±0.1 nm, respectively, that may be observed using a scanning electron microscope (SEM) in accordance with some embodiments. These patterned photoresists 60Aa and 60Ab are derived from a photoresist layer 60 spin coated on a substrate and exposed using the EUV radiation with a dose of 169±10 $mJ/cm^2$, in which the pattern starts to form under the EUV with a dose of 150±10 $mJ/cm^2$. The patterned photoresists 60Aa and 60Ab each have a single carboxylate ligand having the formula (G1):

(G1)

Formula (G1)

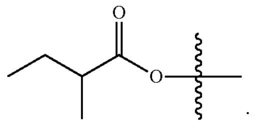

That is, the patterned photoresists 60Aa and 60Ab each have the formula (A2-1). The patterned photoresists 60Aa and 60Ab each have a thickness in a range from 22 nm to 25 nm, for example, 23.4 nm in some embodiments. No defect is observable in FIGS. 7A and 7B. For example, the patterned photoresists 60Aa and 60Ab have a well-defined line, edge and space.

The patterned photoresists 60Aa and 60Ab have an improved edge roughness (LWR) and an improved critical dimension uniformity (CDU). The patterned photoresists 60Aa and 60Ab have a uniform pitch and a uniform half-pinch (HP). For example, in FIG. 7A, some of the patterned photoresists 60Aa have a pitch p2 of 50.6±0.2 nm, a pitch p4 of 47.6±0.2 nm, a pitch p6 of 51.6±0.2 nm, a half pitch hp2 of 22.8±0.2 nm and a half pitch hp4 of 24.8±0.2 nm. In FIG. 7B, some of the patterned photoresists 60Ab have a pitch p8 of 46.6±0.2 nm, a pitch p10 of 44.6±0.2 nm, a pitch p12 of 43.6±0.2 nm, a half pitch hp6 of 22.8±0.2 nm and a half pitch hp8 of 21.8±0.2 nm.

Figure 8B:
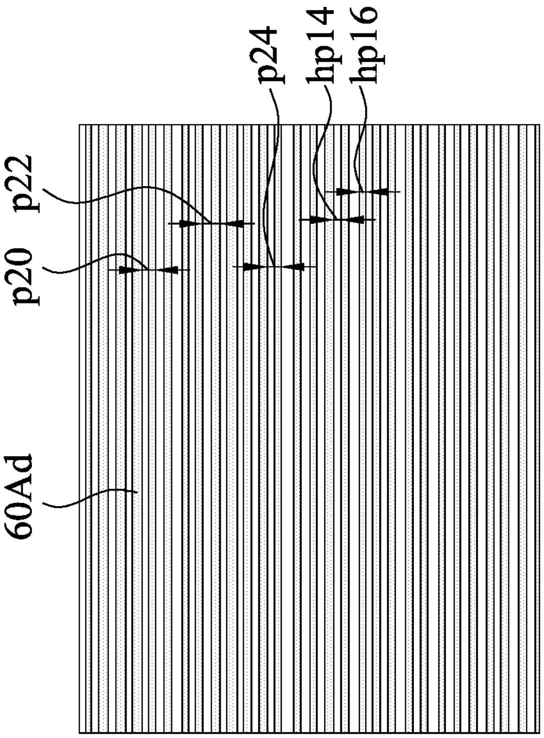
FIGS. 8A and 8B illustrate a top view of patterned photoresists with a half-pinch (HP) of 22±0.1 nm and a top view of the patterned photoresists with a half-pinch (HP) of 16±0.1 nm, respectively, that may be observed using a scanning electron microscope (SEM) in accordance with some embodiments.
Figure 8A:
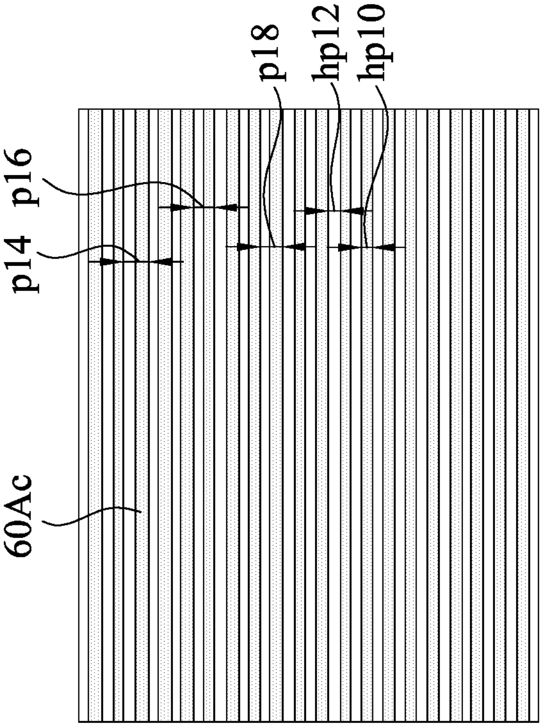

FIGS. 8A and 8B illustrate a top view of patterned photoresists 60Ac with a half-pinch (HP) of 22±0.1 nm and a top view of the patterned photoresists 60Ad with a half-pinch (HP) of 16±0.1 nm, respectively, that may be observed using a scanning electron microscope (SEM) in accordance with some embodiments. These patterned photoresists 60Ac and 60Ad are derived from a photoresist layer spin coated on a substrate and exposed using the EUV radiation with a dose of 169±10 $mJ/cm^2$, in which the pattern starts to form under the EUV radiation with a dose of 131±10 $mJ/cm^2$. The patterned photoresists 60Ac and 60Ad each have two different carboxylate ligands having the formulae (G1) and (G2) in this embodiment.

Formula (G1)

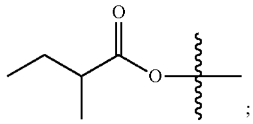

($C_5H_9O_2$)

; and

Formula (G2)

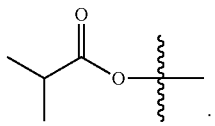

($C_4H_7O_2$)

That is, the patterned photoresists 60Ac and 60Ad each have the formula (A2): $Hf_6O_4(OH)_6(RCO_2)_{10}$ being $Hf_6O_4(OH)_6(C5H_9O_2)_6(C_4H_7O_2)_4$. The patterned photoresists 60Ac and 60Ad each have a thickness in a range from 22 nm to 25 nm, for example, 23.8 nm. No defect is observable in FIGS. 8A and 8B. For example, the patterned photoresists 60Ac and 60Ad have a well-defined line, edge and space.

The patterned photoresists 60Ac have an improved edge roughness (LWR) and an improved critical dimension uniformity (CDU). In some embodiments, the patterned photoresists may have a uniform pitch and a uniform half-pinch (HP). In FIG. 8A, for example, some of the patterned photoresists have a pitch p14 of 47.4±0.2 nm, a pitch p16 of 43.5±0.2 nm, a pitch p18 of 49.4±0.2 nm, a half pitch hp10 of 26.7±0.2 nm and a half pitch hpl2 of 19.8±0.2 nm. In FIG. 8B, for example, the patterned photoresists have a pitch p20 of 32.7±0.2 nm, a pitch p22 of 30.7±0.2 nm, a pitch p24 of 33.6±0.2 nm, a half pitch hp14 of 17.8±0.2 nm and a half pitch hp16 of 12.9±0.2 nm.

Figure 9B:
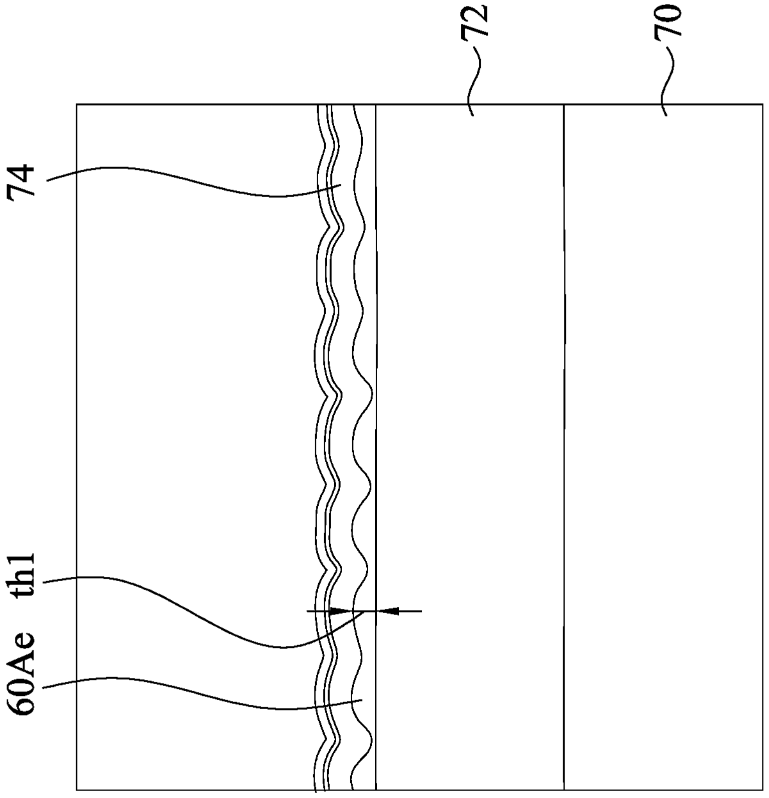
FIG. 9B is a cross-sectional view of FIG. 9A.
Figure 9A:
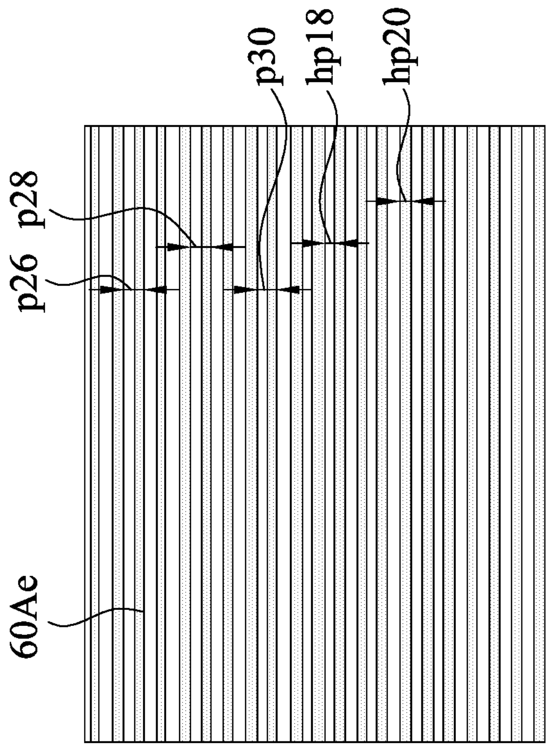
FIG. 9A illustrates a top view of patterned photoresists with a half-pinch (HP) of 22±0.1 nm that may be observed using a scanning electron microscope (SEM) in accordance with some embodiments.

FIG. 9A illustrates a top view of patterned photoresists 60Ae with a half-pinch (HP) of 22±0.1 nm that may be observed using a scanning electron microscope (SEM) in accordance with some embodiments. FIG. 9B is a cross-sectional view of FIG. 9A. These patterned photoresists 60Ae are derived from a photoresist layer spin coated on a substrate 70 having an overlying silicon oxide layer 72 and exposed using the EUV radiation with a dose of 178±10 $mJ/cm^2$, and are coated with platinum (Pt) 74 for SEM measurement. The patterned photoresists 60Ae have the formula (A2): $Hf_6O_4(OH)_6(RCO_2)_{10}$ being $Hf_6O_4(OH)_6(C_5H_9O_2)_6(C_4H_7O_2)_4$. The patterned photoresists 60Ae each have a thickness th1 in a range from 11 nm to 13 nm, for example, 12.0 nm or 12.4 nm. The patterned photoresists 60Ae have an improved edge roughness (LWR) and an improved critical dimension uniformity (CDU). In some embodiments, the patterned photoresists 60Ae may have a uniform pitch and a uniform half-pitch (HP). For example, in FIG. 8A, the patterned photoresists 60Ae have a pitch p26 of 43.7±0.2 nm, a pitch p28 of 44.6±0.2 nm, a pitch p30 of 43.7±0.2 nm, a half pitch hp18 of 21.8±0.2 nm and a half pitch hp20 of 21.8±0.2 nm. As can be seen in FIG. 8B, the silicon oxide layer 72 remains intact after developing the photoresist layer to form the patterned photoresists 60Ae.

Figure 10B:
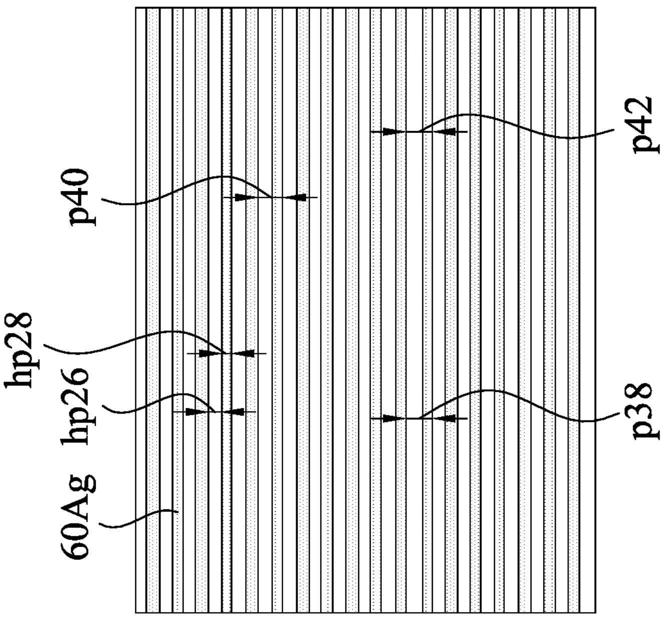
FIG. 10B illustrates a top view of the patterned photoresists with a half-pinch (HP) of 26±0.1 nm that may be observed using a scanning electron microscope (SEM) in accordance with some embodiments.
Figure 10A:
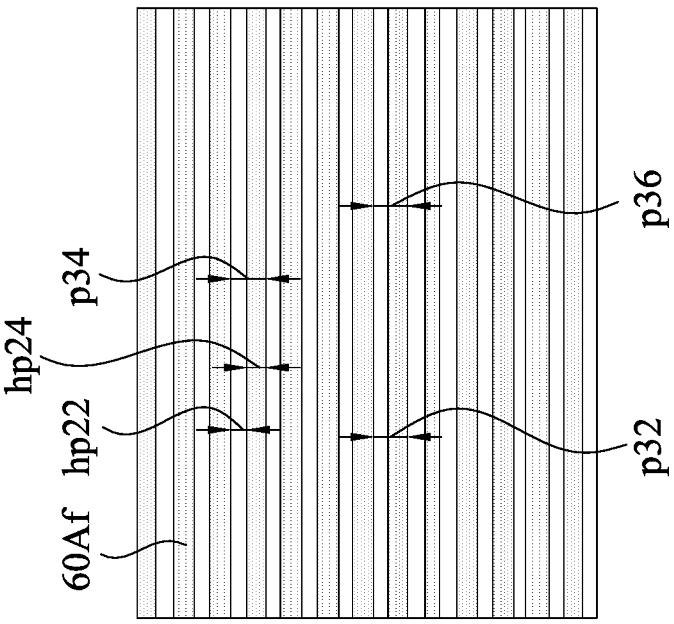
FIG. 10A illustrates a top view of the patterned photoresists with a half-pinch (HP) of 37±0.1 nm that may be observed using a scanning electron microscope (SEM) in accordance with some embodiments.

FIG. 10A illustrates a top view of the patterned photoresists 60Af with a half-pinch (HP) of 37±0.1 nm that may be observed using a scanning electron microscope (SEM) in accordance with some embodiments. These patterned photoresists 60Af are derived from a photoresist layer spin coated on a substrate and exposed using EUV with dose of 100±10 $mJ/cm^2$. FIG. 10B illustrates a top view of the patterned photoresists 60Ag with a half-pinch (HP) of 26±0.1 nm that may be observed using a scanning electron microscope (SEM) in accordance with some embodiments. These patterned photoresists 60Ag are derived from a photoresist layer spin coated on a substrate and exposed using EUV with dose of 130±10 mJ/$cm^2$. The patterned photoresists 60Af and 60Ag are made of a mixture of a first photoresist and a second photoresist different from the first photoresist. The first photoresist has the formula (A2-1): $Hf_6O_4(OH)_6(C_4H_9CO_2)_{10}$. The second photoresist has the formula (A1-1): $Zr_{12}O_8(OH)_{14}(C_4H_9CO_2)_{18}$. A ratio of the first photoresist to the second photoresist is about 2:1. The patterned photoresists 60Af and 60Ag each have a thickness in a range from 22 nm to 25 nm, for example, 24 nm. A photoresist layer including the first photoresist and the second photoresist can be formed into a smooth film over a large area, such as an area having a length of 400 μm to 600 μm, such as 500 μm and a width of 500 μm to 700 μm, such as 600 μm. In some embodiments, the surface of the photoresist layer with a thickness in the range from 22 nm to 25 nm, for example, 24 nm formed on an area having a square geometry with a dimension of 4 μm to 6 μm, such as 5 μm, may have a surface roughness ($R_{rms}$) of 0.7 nm to 0.9 nm, such as 0.78 nm measured by means of the atomic force microscope (AFM).

The patterned photoresists 60Af and 60Ag have an improved edge roughness (LWR) and an improved critical dimension uniformity (CDU). In some embodiments, the patterned photoresists 60Af may have a uniform pitch and a uniform half-pinch (HP). For example, in FIG. 10A, the patterned photoresists 60Af have a pitch p32 of 75.3±0.2 nm, a pitch p34 of 74.4±0.2 nm, a pitch p36 of 72.4±0.2 nm, a half pitch hp22 of 34.7±0.2 nm and a half pitch hp24 of 33.7±0.2 nm. In some embodiments, the patterned photoresists 60Ag may have a uniform pitch and a uniform half-pinch (HP). For example, in FIG. 10B, the patterned photoresists 60Ag have a pitch p38 of 53.5±0.2 nm, a pitch p40 of 50.6±0.2 nm, a pitch p42 of 55.5±0.2 nm, a half pitch hp26 of 30.7±0.2 nm and a half pitch hp28 of 19.8±0.2 nm.

Figure 11B:
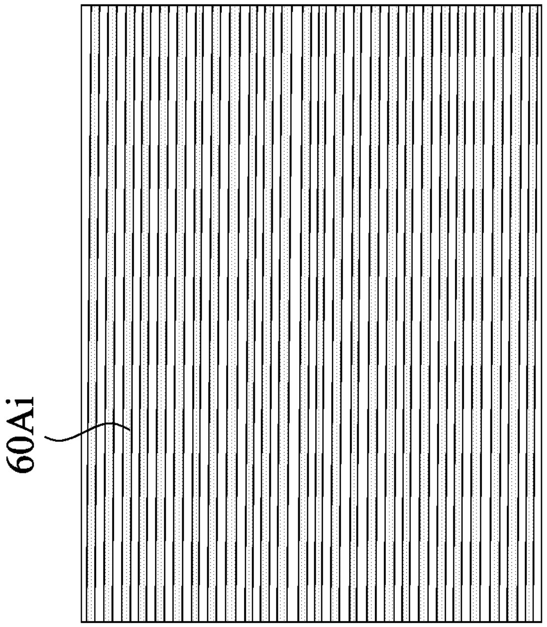
FIG. 11B illustrates a top view of the patterned photoresists with a half-pinch (HP) of 18±0.1 nm that may be observed using a scanning electron microscope (SEM) in accordance with some embodiments.
Figure 11A:
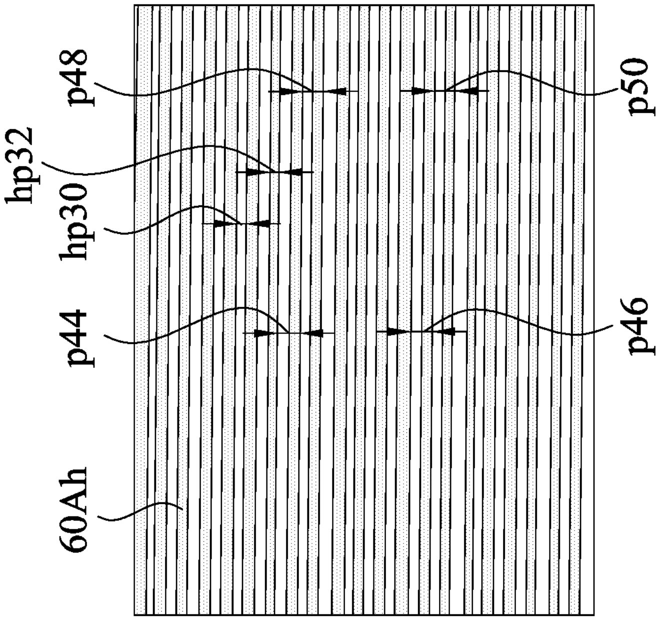
FIG. 11A illustrates a top view of patterned photoresists with a half-pinch (HP) of 22±0.1 nm which may be observed using a scanning electron microscope (SEM) in accordance with some embodiments.
Figure 12:
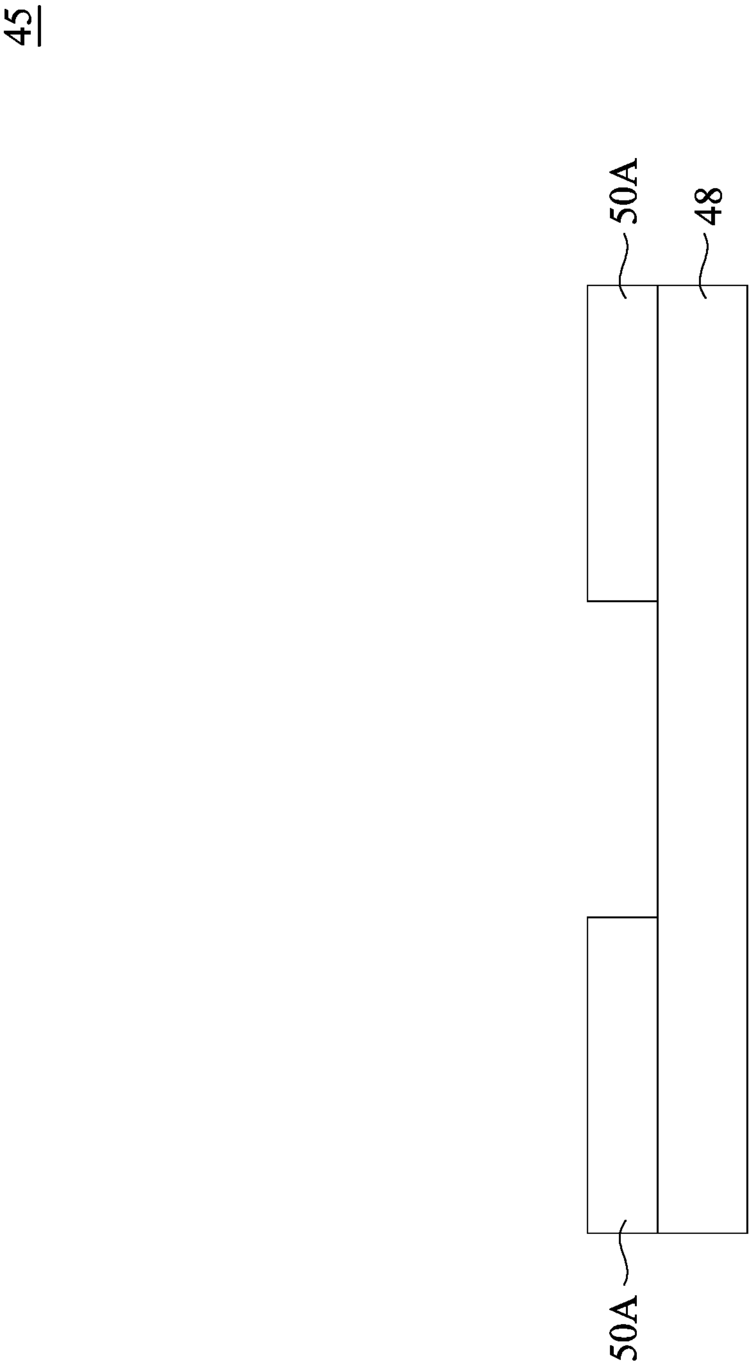
FIG. 12 is a diagrammatic fragmentary cross-sectional side view of a semiconductor device at various stages of fabrication in accordance with various aspects of the present disclosure.

FIG. 11A illustrates a top view of patterned photoresists 60Ah with a half-pinch (HP) of 22±0.1 nm which may be observed using a scanning electron microscope (SEM) in accordance with some embodiments. These patterned photoresists 60Ah are derived from a photoresist layer spin coated on a substrate and exposed using the EUV radiation with a dose of 27±2 mJ/$cm^2$. FIG. 11B illustrates a top view of the patterned photoresists 60Ai with a half-pinch (HP) of 18±0.1 nm that may be observed using a scanning electron microscope (SEM) in accordance with some embodiments. These patterned photoresists 60Ah and 60Ai are derived from a photoresist layer spin coated on a substrate and exposed using EUV with dose of 30±2 mJ/$cm^2$. The patterned photoresists 60Ah and 60Ai are made of a mixture of a first photoresist and a second photoresist different from the first photoresist. The first photoresist is a 6Sn-2Cl oxide cluster and has the formula (G3):

Formula (G3)

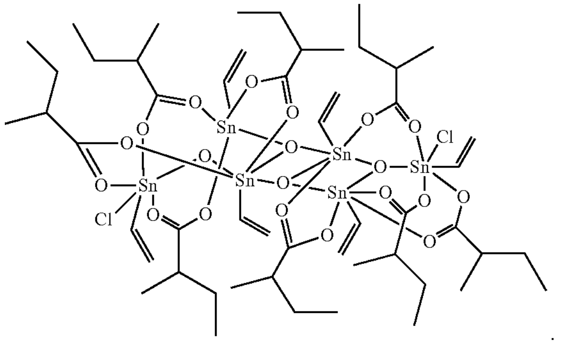

.

The second photoresist has the formula (A2-2): $Hf_6O_4(OH)_6(C4H_9CO_2)_{10}$. A ratio of the first photoresist to the second photoresist is about 2:1. The patterned photoresists 60Ah and 60Ai each have a thickness in a range from 20 nm to 25 nm, for example, 22.12 nm. A photoresist layer including the first photoresist and the second photoresist can be formed into a smooth film over a large area, such as an area having a length of 400 μm to 600 μm, such as 500 μm and a width of 500 m to 700 μm, such as 600 μm. In some embodiments, the surface of the photoresist layer with a thickness in the range from 22 nm to 25 nm, for example, 22.12 nm formed on an area having a square geometry with a dimension of 4 μm to 6 μm, such as 5 μm, may have a surface roughness ($R_{rms}$) of 0.3 nm to 0.5 nm, such as 0.39 nm measured by means of the atomic force microscope (AFM).

In FIG. 11B, the patterned photoresists 60Ai show no defects over a large domain. Referring to FIG. 11A, the patterned photoresists 60Ah have an improved edge roughness (LWR) and an improved critical dimension uniformity (CDU). In some embodiments, the patterned photoresists 60Ah may have a uniform pitch and a uniform half-pinch (HP). For example, in FIG. 11A, the patterned photoresists 60Ah have a pitch p44 of 45.6±0.2 nm, a pitch p46 of 47.6±0.2 nm, a pitch p48 of 40.7±0.2 nm, a pitch p50 of 43.7±0.2 nm, a half pitch hp30 of 23.8±0.2 nm and a half pitch hp32 of 20.8±0.2 nm.

Using the patterned photoresists 60A (see FIG. 6) as a mask, additional fabrication processes such as etching or implantation may be performed. For example, referring to FIG. 12, the material layer 50 is etched into patterned material layers 50A separated by a recess. Thereafter, the patterned photoresists 60A may be removed by a photoresist removal process known in the art, such as a stripping or an ashing process.

Although the discussions above use EUV lithography as an example, it is understood that the various aspects of the photoresist layer may apply to other types of lithography as well, such as an e-beam lithography.

Figure 13:
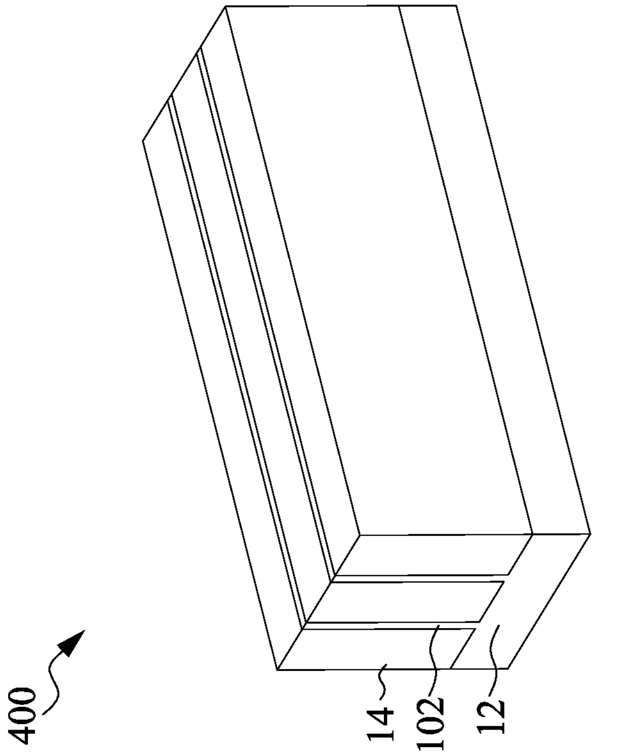
FIGS. 13, 14, and 15A illustrate perspective views of additional fabrication processes in the formation of a semiconductor device on a substrate in accordance with some embodiments of the present disclosure.
Figure 14:
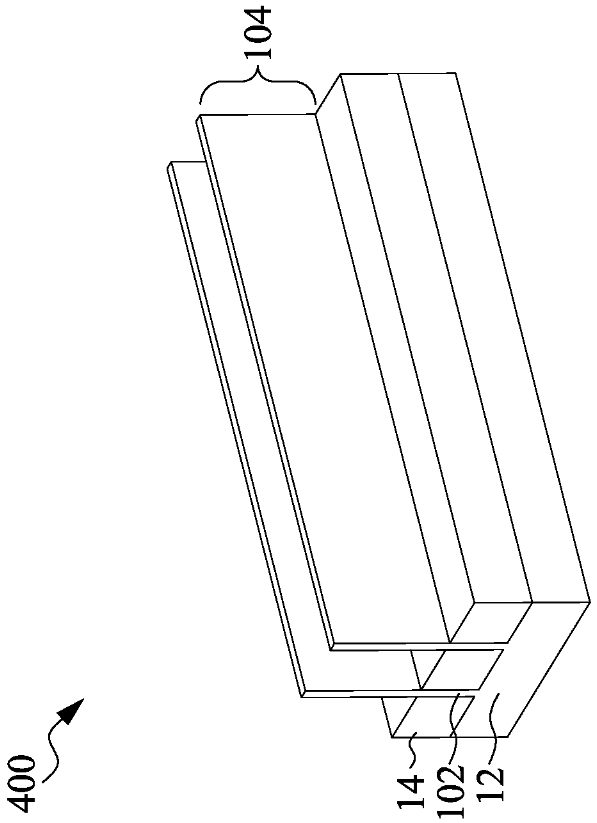
Figure 15A:
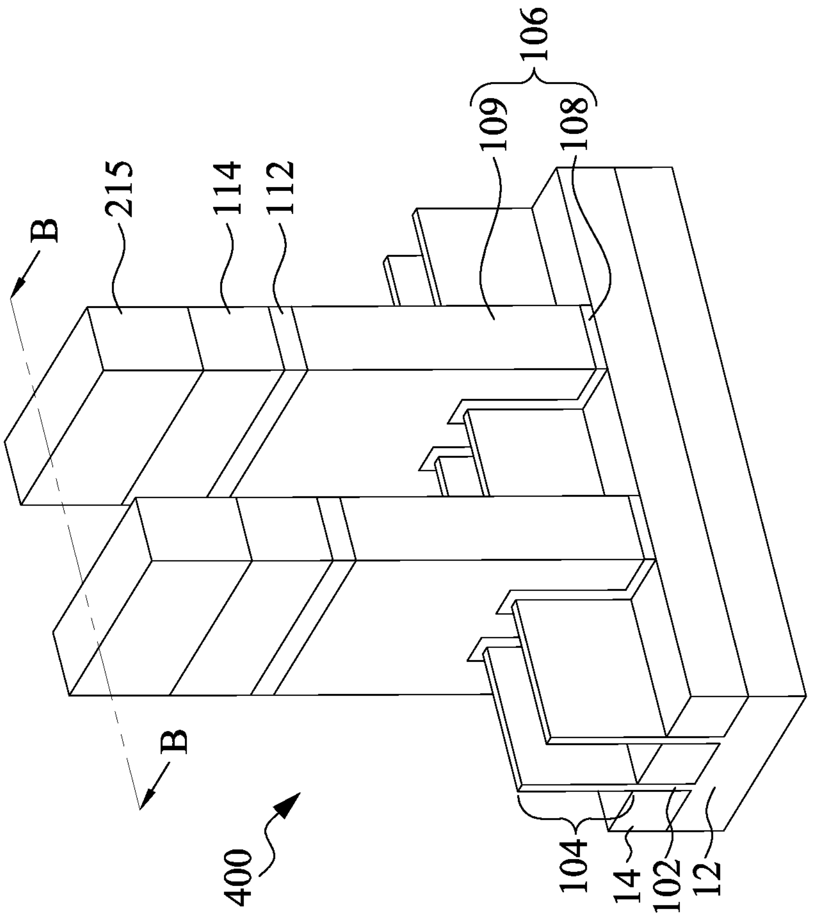

FIGS. 13, 14, and 15A illustrate perspective views of additional fabrication processes in the formation of a semiconductor device 400 on a substrate 12 in accordance with some embodiments of the present disclosure. FIGS. 15B, 16, 17 and 18 illustrate cross-sectional views of additional fabrication processes in the formation of a semiconductor device 400 using a substrate 12 in accordance with some embodiments of the present disclosure. Reference is made to FIG. 13. FIG. 13 illustrates a perspective view of an initial structure. The initial structure includes the substrate 12. The substrate 12 is similar to the material layer 50 in terms of composition and formation, such as being patterned by the photoresist layer 60 as discussed previously with respect to FIGS. 3, 5, 6 and 12. Isolation regions such as shallow trench isolation (STI) regions 14 may be formed to extend into the substrate 12. The portions of substrate 12 between neighboring STI regions 14 are referred to as semiconductor strips 102. As discussed previously, with reference to FIGS. 3, 5, 6 and 12, by using the photoresist layer 60, an improvement of resolution of margin of patterns of the substrate 12 (e.g., the semiconductor strips 102) can be improved.

The STI regions 14 may include a liner oxide (not shown). The liner oxide may be formed of a thermal oxide formed through a thermal oxidation of a surface layer of the substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 14 may also include a dielectric material over the liner oxide, and the dielectric material may be formed using flowable chemical vapor deposition (FCVD), spin-on coating, or the like.

Referring to FIG. 14, the STI regions 14 are recessed, so that the top portions of semiconductor strips 102 protrude higher than the top surfaces of the neighboring STI regions 14 to form protruding fins 104. The etching may be performed using a dry etching process or a wet etching process.

The materials of fins 104 may also be replaced with materials different from that of substrate 12. For example, if the fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the fins 104 serve for p-type transistors, the protruding fins 104 may be formed of Si, SiGe, SiGeB, Ge, or a III-V compound semiconductor such as InSb, GaSb, InGaSb, or the like.

Figure 15B:
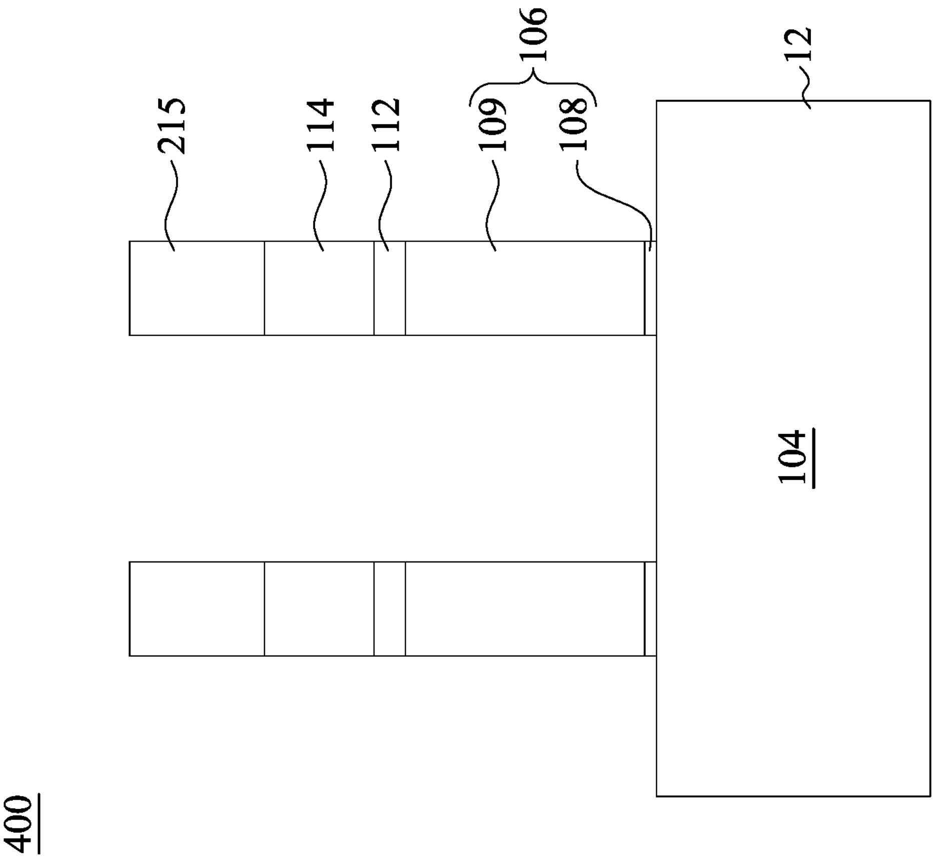
FIGS. 15B, 16, 17 and 18 illustrate cross-sectional views of additional fabrication processes in the formation of a semiconductor device using a substrate in accordance with some embodiments of the present disclosure.

Referring to FIGS. 15A and 15B, dummy gate structures 106 are formed on the top surfaces and the sidewalls of fins 104. FIG. 15B illustrates a cross-sectional view obtained from a vertical plane containing line B-B in FIG. 15A. Formation of the dummy gate structures 106 includes depositing in sequence a blankly formed gate dielectric layer and a blankly formed dummy gate electrode layer across the fins 104, followed by patterning the blanket formed gate dielectric layer and the blankly formed dummy gate electrode layer. As a result of the patterning, the dummy gate structure 106 includes a dummy gate dielectric layer 108 and a dummy gate electrode 109 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 109 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of fins 104. The dummy gate structures 106 may have lengthwise directions perpendicular to the lengthwise directions of the respective fins 104.

The blankly formed dummy gate electrode layer and the blankly formed gate dielectric layer may be patterned using a tri-layer structure. Bottom masks 112, top masks 114 and photoresist layers 215 are formed over the blankly formed dummy gate electrode layer in sequence. The photoresist layers 215 may be similar to the patterned photoresist 60A in terms of composition and formation methods as discussed previously with regard to FIGS. 3, 5 and 6.

In an alternative embodiment, the bottom masks 112 and the top masks 114 are made of one or more layers of $SiO_2$, SiCN, SiON, $Al_2O_3$, SiN, or other suitable materials. In certain embodiments, the bottom masks 112 include silicon nitride, and the top masks 114 include silicon oxide.

Figure 16:
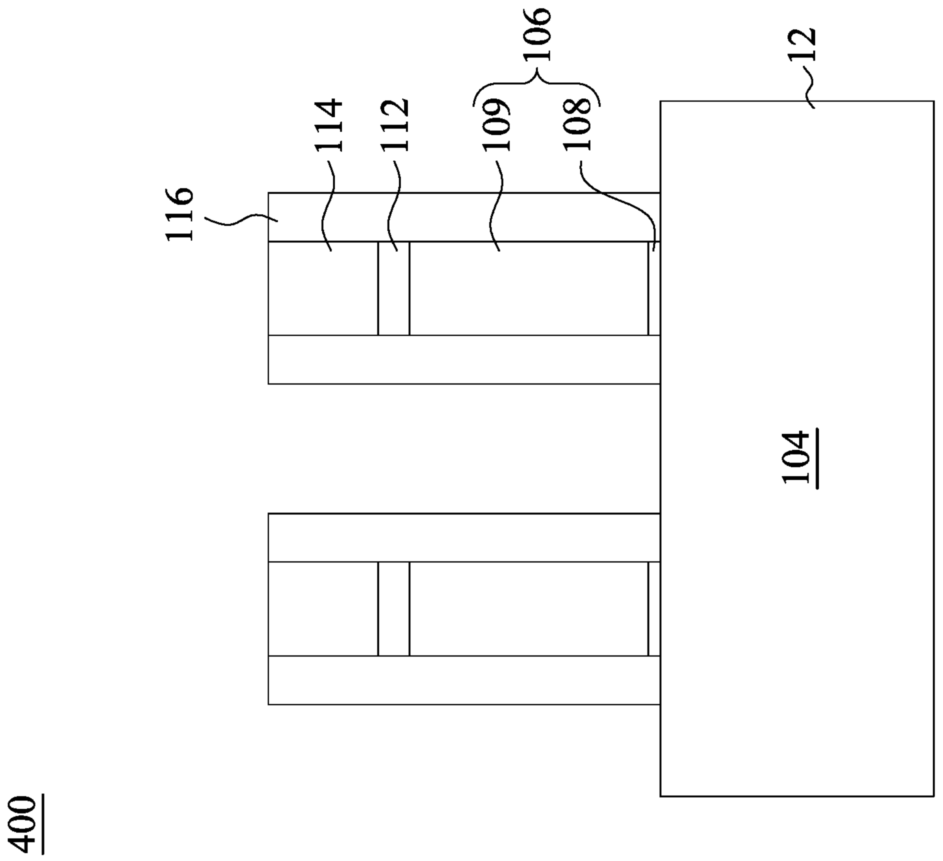

Next, as illustrated in FIG. 16, gate spacers 116 are formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material. The low-k dielectric material has a dielectric constant (k value) of lower than about 3.5. Suitable materials for the low-k dielectric material may include silicon oxide, silicon nitride, silicon oxynitride, or the like. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 17:
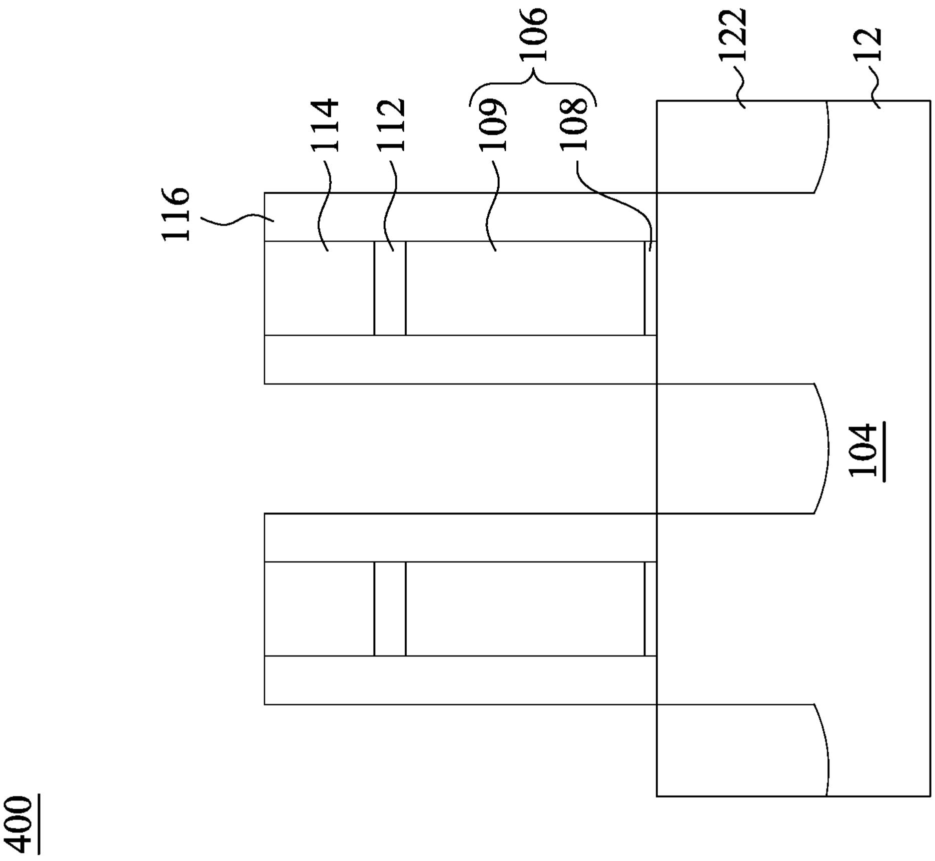

In FIG. 17, after formation of the gate spacers 116 is completed, source/drain epitaxial structures 122 are formed on source/drain regions of the protruding fins 104 that are not covered by the dummy gate structures 1,96 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fins 104 can be recessed using suitable selective etching processing that attacks the fins 104, but hardly attacks the gate spacers 116 and the top masks 114 of the dummy gate structures 106. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 116 and the top masks 114 of the dummy gate structures 106. In some other embodiments, recessing the protruding fins 104 may be performed by a wet chemical etch which etches the fins 104 at a faster etch rate than it etches the gate spacers 116 and the top masks 114 of the dummy gate structures 106. In some other embodiments, recessing the protruding fins 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 104.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including p-type dopants, such as boron or BF2, n-type dopants, such as phosphorus or arsenic, and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 18:
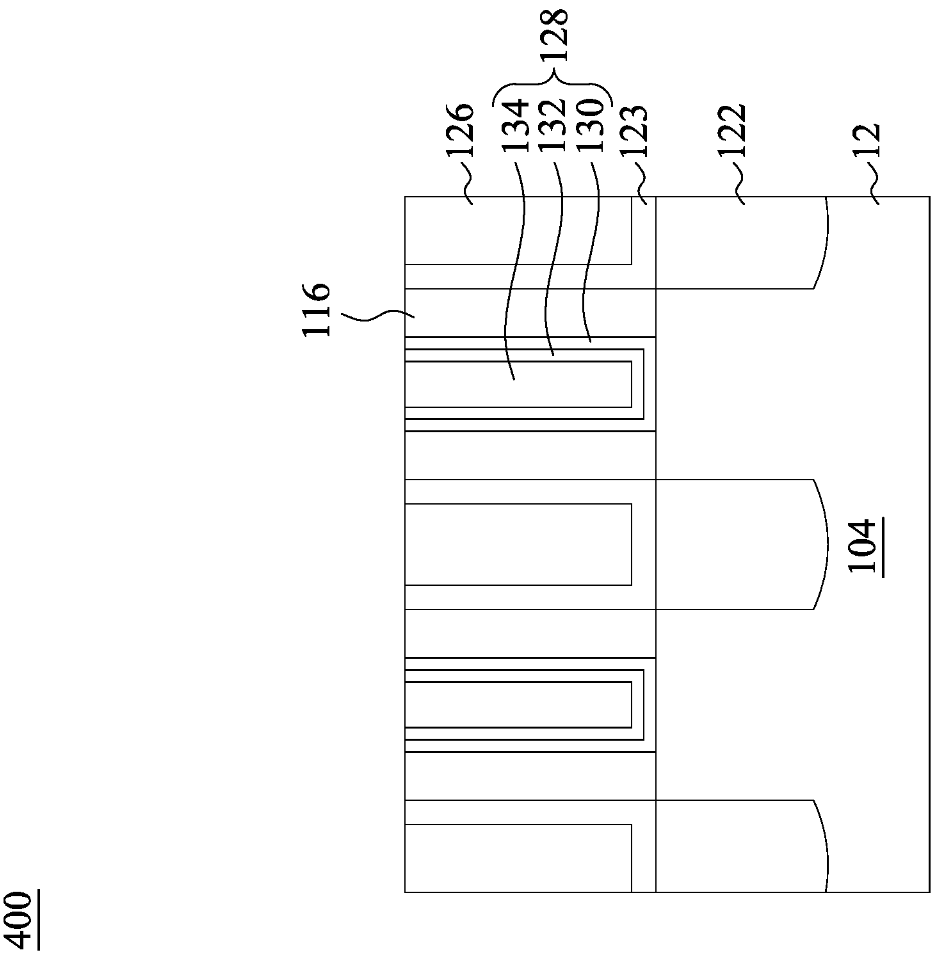

Next, in FIG. 18, a contact etch stop layer (CESL) 123 and an interlayer dielectric (ILD) layer 126 are formed on the substrate 12 in sequence. In some examples, the CESL 123 includes a silicon nitride layer, silicon oxide layer, a silicon oxynitride layer, and/or other suitable materials having a different etch selectivity than the ILD layer 126. The CESL 123 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSQ), and/or other suitable dielectric materials having a different etch selectivity than the CESL 123. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 123. For example, a planarization process includes a chemical mechanical planarization (CMP) process which removes portions of the ILD layer 126 and the CESL 123 overlying the dummy gate structures 106. In some embodiments, the CMP process also removes bottom masks 112 and top masks 114 (as shown in FIG. 16) and exposes the dummy gate electrodes 109.

An etching process is performed to remove the dummy gate electrode 109 and the dummy gate dielectric layer 108, resulting in gate trenches between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate spacers 116 and/or the ILD layer 126).

Thereafter, replacement gate structures 128 are respectively formed in the gate trenches. The gate structures 128 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 128 forms the gate associated with the three-sides of the channel region provided by the fin 104. Stated another way, each of the gate structures 128 wraps around the fin 104 on three sides. In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trenches. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 132 and/or the fill metal 134 used within high-k/metal gate structures 128 may include a metal, metal alloy, or metal silicide. Formation of the high-k/metal gate structures 128 may include multiple deposition processes to form various gate materials, one or more liner layers, and one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON).

The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HfriO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti); tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 400 includes other layers or features not specifically illustrated. In some embodiments, back end of line (BEOL) processes are performed on the semiconductor device 400. In some embodiments, the semiconductor device 400 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photoresist layer includes a first photo-active compound having the formulae (A1) and (A2) such that the photoresist layer can be formed into a substantially large area with a smooth surface morphology. Another advantage is that the photoresist layer can exhibit an improved contrast at a low exposure does of the EUV radiation after being patterned. Yet another advantage is that an improvement of the resolution of margin of hole or patterns in the material layer can be achieved.

Figure 19:
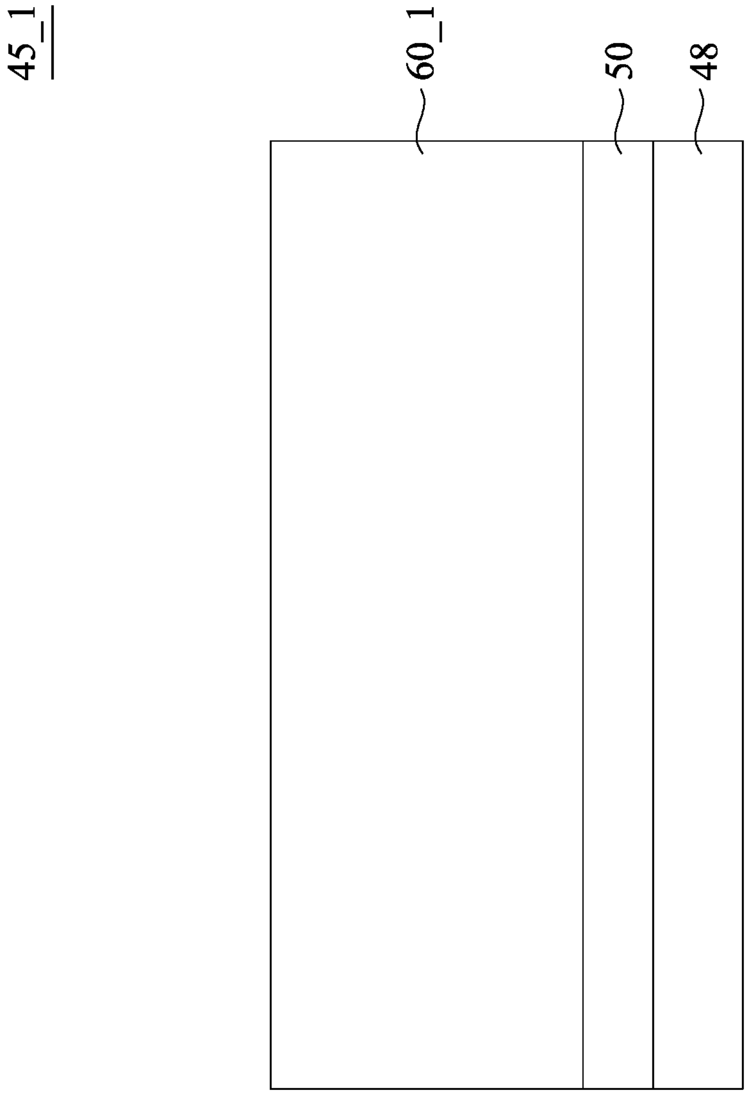
FIGS. 19-21 are cross-sectional side views of a semiconductor device at various stages of fabrication in accordance with various aspects of the present disclosure.
Figure 20:
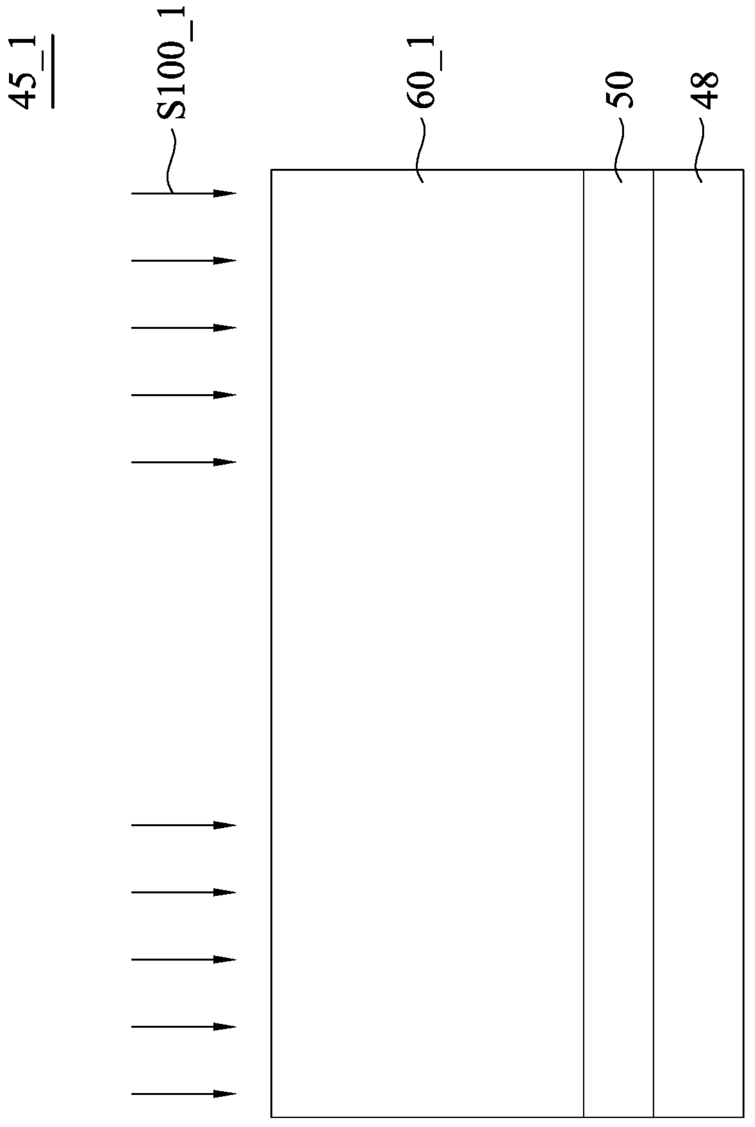
Figure 21:
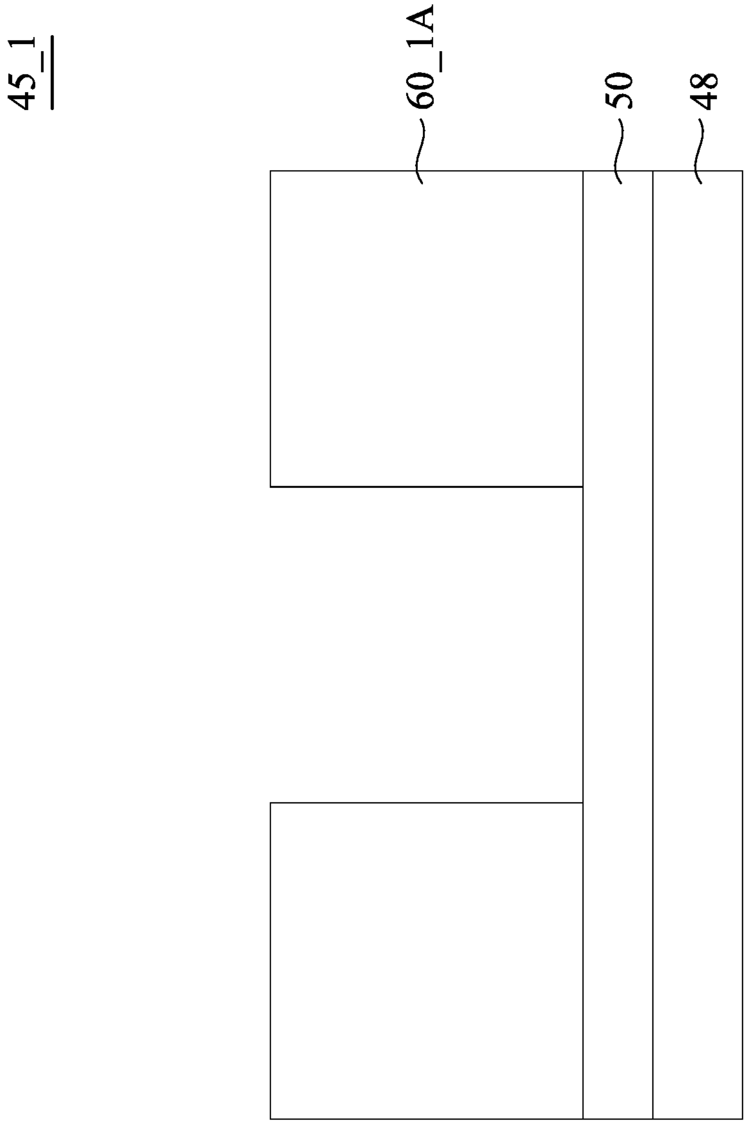

FIGS. 19-21 are cross-sectional side views of forming a semiconductor device 45_1 at various stages of fabrication in accordance with various aspects of the present disclosure. FIG. 19 illustrates a resulting structure after the photoresist layer 60_1 has been formed on the material layer 50. Reference is made to FIG. 19. A photoresist composition is deposited on the material layer 50 to form the photoresist layer 60_1. The photoresist layer 60_1 may be formed by a spin-coating process. The photoresist layer 60_1 includes a solvent and one or more photo-active compounds dissolved in the solvent. The solvent includes an appropriate organic solvent for an adjustment of its viscosity. Such organic solvent includes, but is not limited to, 4-methyl-2-pentanol. The photo-active compounds are in an amount from about 1.5 wt % to about 2.5 wt %, such as about 2.0 wt % with respect to a weight of a photoresist composition of the photoresist layer 60_1. In another example, the photoresist composition of the photoresist layer 60_1 may include an acid labile molecule, a polymer, photoacid generator (PAG), quencher, chromophore, crosslinker, surfactant, or a combination thereof.

In some embodiments, the photoresist composition to deposit the photoresist layer 601 includes a first photo-active compound in which the first photo-active compound is a metal oxide-containing compound. In some embodiments, the first photo-active compound is a 6 Hf-containing oxide. In other words, the first photo-active compound may be an oxide containing Hf. The first photo-active compound is a highly hydroxylated Hf-containing oxide cluster or a highly hydroxylated 6Hf-oxo cluster, and may be represented by a formula (A3):

Formula (A3)

$$Hf_6O_4(OH)_8(RCO_2)_n(R'CO_2)_{8-n}.$$

Herein, illustrative examples of R in the formula (A3) may be represented by the formulae (1) to (6) as discussed previously with respect to FIG. 3, and by a formula (7):

Formula (7)

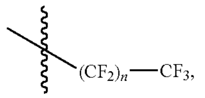

in which n is 0 to 3. The first photo-active compound with the formula (A3) has an amount of OH group greater than an amount of OH group of the first photo-active compound with the formula (A2). By replacement of the carboxylate ligand with the OH group, a molecular interdistance of the first photo-active compound can be increased, and a density of Hf in the first photo-active compound can be increased as well. The first photo-active compound can allow the photoresist layer 601 to retain a substantially unchanged film thickness after an exposure process and photoresist cleaning or developing. In some embodiments, the first photo-active compound may aggregate by a radiation, for example, an EUV radiation, and thus may provide an image contrast after being developed. A mechanism for photo-aggregation of the first photo-active compound proceeds through a plurality of reactions including a hydroxyl degradation and a photo-substitution of a carboxylate ligand with an OH ligand or an OH group. For example, the hydroxyl degradation can be shown in a general reaction scheme 4-1 below:

Reaction scheme 4-1

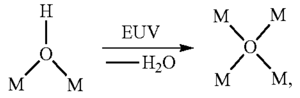

in which M is Hf in the reaction scheme 4-1. In some embodiments, the photo-substitution of the carboxylate ligand with the OH ligand can be shown in a general reaction scheme 4-2 below:

Reaction scheme 4-2

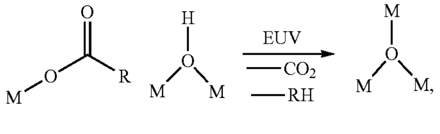

in which M in the reaction scheme 4-2 is Hf in the reaction scheme 4-2, and R in the reaction scheme 4-2 is one of the formulae (1) to (7) as discussed above. Because the photo-aggregation proceeds through a plurality of reactions including the reaction scheme 4-1 and the reaction scheme 4-2, the photoresist composition enables using a low EUV dose to obtain patterns with small half pitch. For example, an exposure dose of the EUV radiation required to pattern the photoresist layer 60_1 into the a pattern with a half-pitch in a range from about 16 nm to about 50 nm is low, for example, in a range from about 30 $mJ/cm^2$ to about 90 $mJ/cm^2$.

In some embodiments, the first photo-active compound is synthesized by a plurality of steps such as a first reaction and followed by a second reaction. In some embodiments, the first reaction is to react $M(OBu)_4$ with a first compound C1 and a second compound C2 as shown in a general reaction scheme 1-2 as discussed previously with regard to FIG. 3 to form the second photo-active compound having a formula (B3):

Formula (B3)

$$Hf_6O_4(OH)_4(RCO_2)_n(R'CO_2)_{12-n}H_2O,$$
$$\bullet 3RCO_2H$$

in which R and R' in the formula (B3) is one of the formulae (1) to (7) as discussed above. In some embodiments, the first compound C1 and the second compound C2 can be represented by the formula (C1-a) and the formula (C2-a) respectively, by the formula (C1-b) and the formula (C2-b) respectively, by the formula (C1-c) and the formula (C2-c) respectively, by the formula (C1-d) and the formula (C2-d) respectively, by the formula (C1-e) and the formula (C2-e) respectively, by the formula (C1-f) and the formula (C2-f) respectively, or by the formula (C1-g) and the formula (C2-g) respectively. In some embodiments, the first compound C1 and the second compound C2 can be represented by formulae (C1-h) and (C2-h), respectively:

Formula (C1-h)

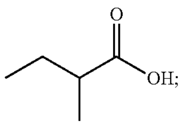
and

-continued

Formula (C2-h)

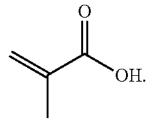

Figure 24:
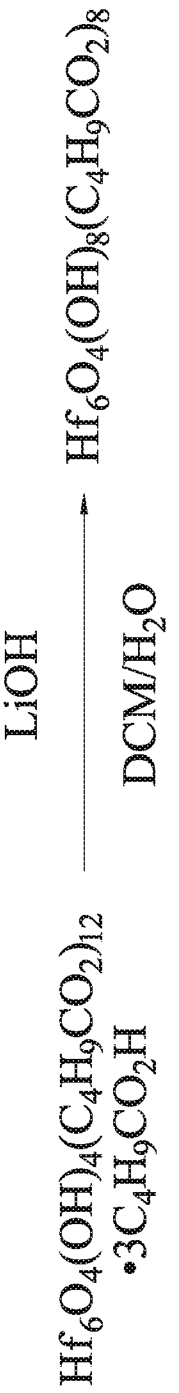
FIG. 24 is a Reaction Scheme 2-3 where R in the Reaction Scheme 2-3 has the formula (2) or $C_4H_9$, R' in the Reaction Scheme 2-3 has the formula (2) or $C_4H_9$.
Figure 25:
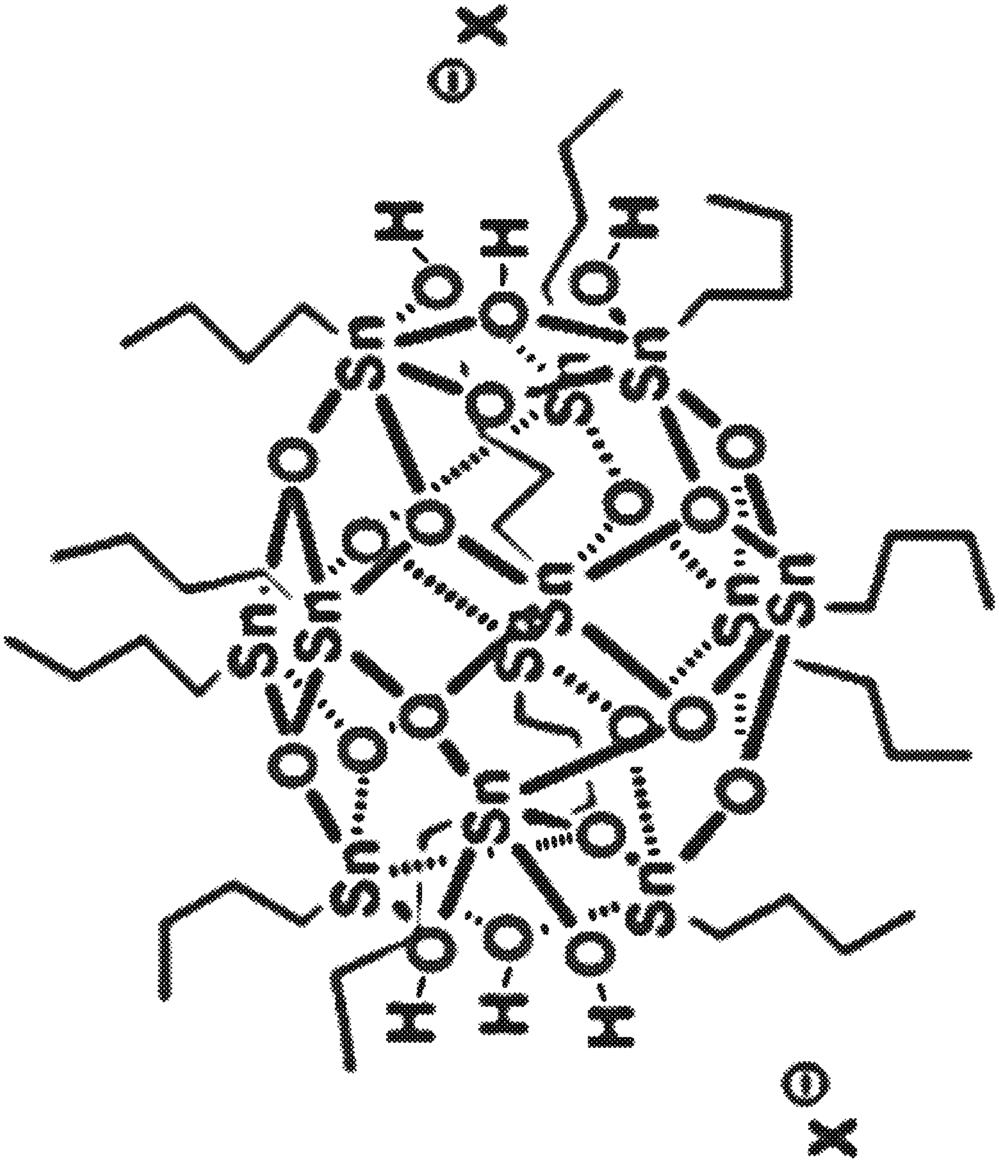
FIG. 25 is a formula (H1).

In some embodiments, the second reaction is a hydrothermal process, which is to react a product obtained from the first reaction with one or more strong bases as shown in a general reaction scheme 2-3 in FIG. 23 in a dichloromethane (DCM) and/or $H_2O$ to form the first photo-active compound having the formulae (A3) as discussed above: The strong base is M'OH or $M'_2CO_3$, in which M' is Li, Na, K, Rb, Cs or $R_4N$, and R of $R_4N$ may be an alkyl group having 1 to 4 carbon atoms. In some embodiments, the hydrothermal process is a chemical reaction that is operated in a sealed and pressured container (e.g., a vessel), such as in a process pressure greater than about 1 atm. The hydrothermal process may be performed at an elevated temperature. For example, the product obtained from the first reaction and a solution are mixed in a container to form a mixture. After wards, the mixture is heated in the container at a pressed pressure and then is cooled to form the first photo-active compound having the formula (A3). In some embodiments, after the second reaction to form the first photo-active compound, acid residues may be formed. By removing the acid residues, the desired product, which has the formula (A3), can be obtained. In some embodiments where R in the Reaction Scheme 2-3 has the formula (2) or $C_4H_9$, R' in the Reaction Scheme 2-3 has the formula (2) or $C_4H_9$, the Reaction Scheme 2-3 can be shown in FIG. 24. In some embodiments, the molar concentration of LiOH in a solution formed by the LiOH, DCM, $H_2O$ is about 0.05±0.05M. That is, the first photo-active compound may be represented by formula (A3-1):

$$Hf_6O_4(OH)_8(C_4H_9CO_2)_8. \quad \text{(A3-1)}$$

n some embodiments, the photoresist composition to form the photoresist layer 60_1 may include the first photo-active compound and another photoactive compound different from the first photo-active compound. In other words, the photoresist composition includes a blend of photo-active compounds or a mixture of photo-active compounds. For example, the photoresist composition may include the first photo-active compound and a fifth photo-active compound different from the first photo-active compound. Therefore, the photoresist layer 601 may be patterned into a high quality pattern using a low dose of EUV radiation. For example, the photoresist layer 60_1 can be patterned into a pattern with a half pitch of about 17±2 nm using a dose of EUV radiation of about 70 $mJ/cm^2$ to about 90 $mJ/cm^2$. The fifth photo-active compound can be a 12Sn oxide cluster. In other words, the fifth photo-active compound is a tin oxo cluster including 12 tin atoms. An illustrative example of the fifth photo-active compound may be represented by a formula (H1) as shown in FIG. 25,
in which X in the Formula (H1) represents OH or $BF_4$. In some embodiments, a weight ratio of the first photo-active compound to the fifth photo-active compound can be in a range from about 10 to about 0.1.

In some other embodiments, the photoresist composition may be a blend or a mixture of a plurality of the first photo-active compounds with different formulae. Therefore, the photoresist layer 60_1 may be patterned into a high quality pattern with a well-defined line, edge and spacing using a low dose of EUV radiation. For example, the photoresist layer 60_1 can be patterned into a pattern with a half pitch of about 17±2 nm using a low dose of EUV radiation. In some embodiments, a first one of the plurality of the first photo-active compounds may be the first photo-active compound having the formula (A2):

Formula (A2)

$Hf_6O_4(OH)_6(RCO_2)_{10}$, which is the decarboxylated 6Hf cluster obtained from the Reaction Scheme 2-2, and a second one of the first photo-active compound having the formula (A3):

Formula (A3)

$Hf_6O_4(OH)_8(RCO_2)_n(R'CO_2)_{8-n}$, which is obtained from the Reaction Scheme 2-3. In some embodiments, a weight ratio of the first one of the first photo-active compound to the second one of the first photo-active compound can be in a range from about 10 to about 0.1.

In some other embodiments, the photoresist composition may be a blend or a mixture of the first photo-active compound and other photo-active compound which is active to EUV radiation. The first photo-active compound having the formula (A3) is advantageous for the photoresist layer 60_1 forming a smooth film surface with a low roughness. The first photo-active compound is stable in air.

In some embodiments, after the photoresist layer 60_1 is formed on the material layer 50, a soft bake process is performed to the photoresist layer 60_1. Reference is made to FIG. 20. An exposure process S100_1 is performed to expose the photoresist layer 601 to an EUV radiation, as discussed previously with regard to FIG. 5. In some embodiments, the exposed photoresist layer 60_1 turns into a mixture of $HfO_2$ and $HfO_{2-x}(RCO_2)_{2x}$ rather than pure $HfO_2$. After the photoresist layer 60_1 is exposed, the photoresist layer 60_1 can be baked by a post-exposure baking process.

Reference is made to FIG. 21. The exposed photoresist layer 60_1 is developed, forming patterned photoresists 60_1A separated by a recess. In some embodiments, the photoresist layer 60_1 is developed using 2-heptanone, a mixture of 2-heptanone and hexane, the like or a combination thereof. The mixture of 2-heptanone and hexane is in a ratio of about 1:1. In some embodiments, the patterned photoresists 60_1A can have a thickness of small loss as compared to the photoresist layer 60 (see FIG. 20).

Figure 22A:
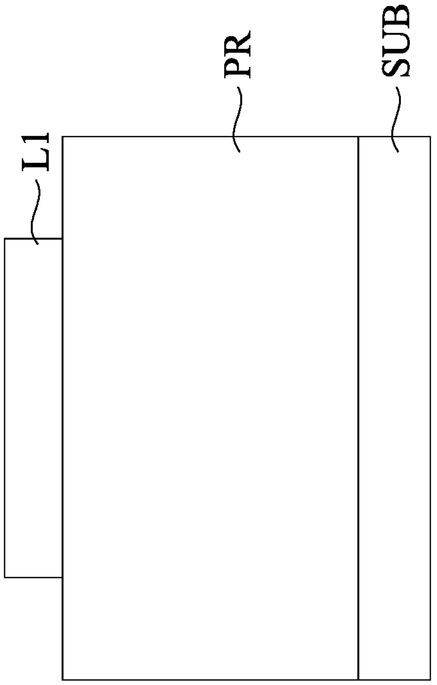
FIGS. 22A and 22B are cross-sectional views of a photoresist layer over a silicon oxide layer over a substrate in accordance with some embodiments.
Figure 22B:
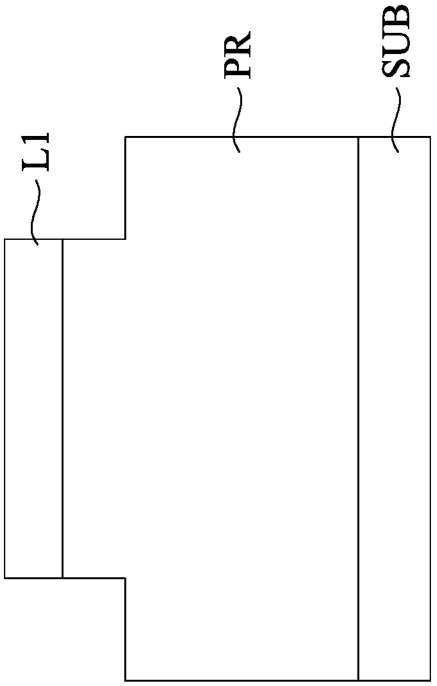

FIGS. 22A and 22B are cross-sectional views of a photoresist layer over a silicon oxide layer over a substrate in accordance with some embodiments. Reference is made to FIG. 22A. A photoresist layer PR is formed on a silicon oxide layer L1 over a substrate SUB. Afterwards, an etching process is performed to the photoresist layer PR, as shown in FIG. 22B. The photoresist layer PR and the silicon oxide layer L1 have substantially the same etch rate, indicating that the photoresist layer PR has an excellent etch performance. For example, a ratio of the silicon oxide layer L1 to the photoresist layer is about 0.95+0.2. In some embodiments, the etching process may be performed by using etchants including $Cl_2$, $CHF_3$, the like, or a combination thereof and an inert gas such as Ar, He, the like, or a combination thereof.

In some embodiments, a method of manufacturing a semiconductor device includes the following steps. A photoresist layer is formed over a material layer on a substrate. The photoresist layer has a composition including a solvent and a first photo-active compound dissolved in the solvent. The first photo-active compound is represented by the following formula (A1) or formula (A2):

Formula (A1)

$Zr_{12}O_8(OH)_{14}(RCO_2)_{18}$; or

Formula (A2)

$Hf_6O_4(OH)_6(RCO_2)_{10}$.

R in the formula (A1) and R in the formula (A2) each include one of the following formulae (1) to (6):

Formula (1)

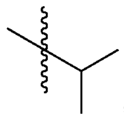

;

Formula (2)

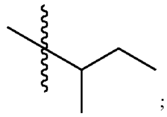

;

Formula (3)

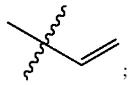

;

Formula (4)

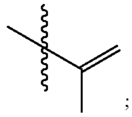

;

Formula (5)

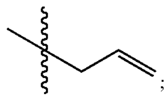

; or

Formula (6)

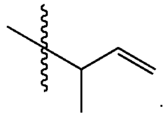

.

The photoresist layer is patterned. The material layer is etched using the photoresist layer as an etch mask. In some embodiments, the photoresist layer includes the following formula (A1-1):

Formula (A1-1)

$Zr_{12}O_8(OH)_{14}(C_4H_9CO_2)_{18}$.

In some embodiments, the photoresist layer includes the following formula (A2-1):

Formula (A2-1)

$Hf_6O_4(OH)_6(C_4H_9CO_2)_{10}$.

In some embodiments, the solvent includes 4-methyl-2-pentanol. In some embodiments, the photoresist layer further comprises a second photo-active compound dissolved in the solvent, the second photo-active compound includes the following formula (E1):

Formula (E1)

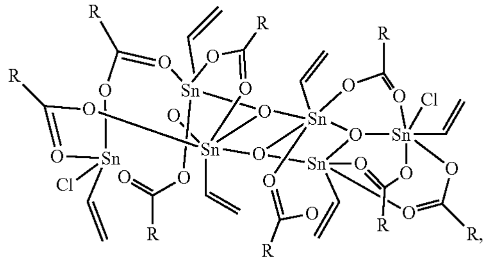

and R in the formula (E1) includes the formulae (1) to (6). In some embodiments, the photoresist layer further comprises a third photo-active compound dissolved in the solvent. The third photo-active compound includes the following formula (F1):

Formula (F1)

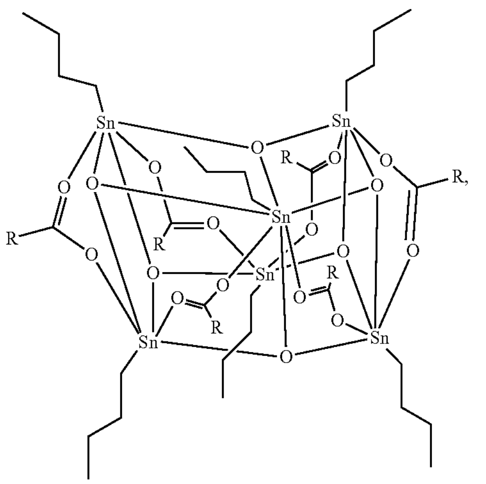

and R in the formula (F1) includes the formulae (1) to (6).

In some embodiments, a method of manufacturing a semiconductor device includes the In some embodiments, a method of forming a first photo-active compound includes the following steps. An $M(OBu)_4$ is reacted with at least one reactant having a carboxylic acid group to form a second photo-active compound. M is Hf or Zr. The second photo-active compound is decarboxylated to form the first photo-active compound. In some embodiments, decarboxylating the second photo-active compound is performed using a base comprising M'OH or $M'2CO_3$, M' is Li, Na, K, Rb, Cs or $R_4N$, and R of $R_4N$ is an alkyl group having 1 to 4 carbon atoms. In some embodiments, the second photo-active compound includes the following formula (B1) or formula (B2):

Formula (B1)

$Zr_{12}O_8(OH)_8(RCO_2)_{24}$; or $\bullet 6RCO_2H$

Formula (B2)

$Hf_6O_4(OH)_4(RCO_2)_{12}H_2O$, $\bullet 3RCO_2H$ and R in the formula (B1) and R in the formula (B2) each include the following formulae (1) to (6):

Formula (1)

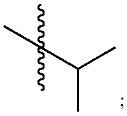

;

Formula (2)

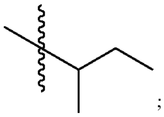

;

Formula (3)

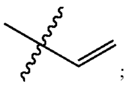

;

Formula (4)

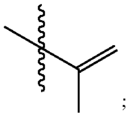

;

Formula (5)

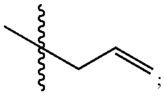

; or

Formula (6)

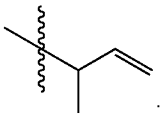

.

In some embodiments, the at least one reactant has a first compound and a second compound including the following formula (C1-a) and formula (C2-a), respectively:

Formula (C1-a)

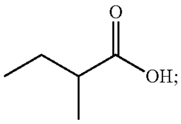

; and

Formula (C2-a)

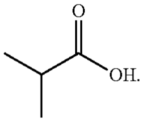

.

In some embodiments, the at least one reactant has a first compound and a second compound including the following formula (C1-b) and formula (C2-b), respectively:

Formula (C1-b)

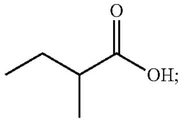

and

Formula (C2-b)

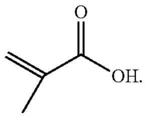

In some embodiments, the at least one reactant has a first compound and a second compound including the following formula (C1-c) and formula (C2-c), respectively:

Formula (C1-c)

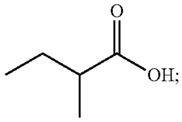

and

Formula (C2-c)

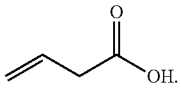

In some embodiments, the at least one reactant has a first compound and a second compound including the following formula (C1-d) and formula (C2-d), respectively:

Formula (C1-d)

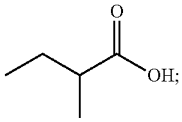

and

Formula (C2-d)

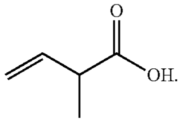

In some embodiments, the at least one reactant has a first compound and a second compound including the following formula (C1-e) and formula (C2-e), respectively:

Formula (C1-e)

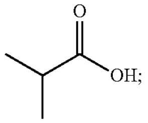

and

Formula (C2-e)

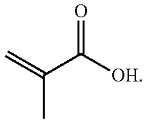

In some embodiments, the at least one reactant has a first compound and a second compound including the following formula (C1-f) and formula (C2-f), respectively:

Formula (C1-f)

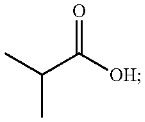

and

Formula (C2-f)

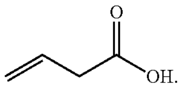

In some embodiments, the at least one reactant has a first compound and a second compound including the following formula (C1-g) and formula (C2-g), respectively:

Formula (C1-g)

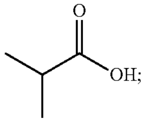

and

Formula (C2-g)

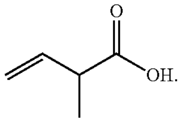

In some embodiments, reacting the $M(OBu)_4$ with the at least one reactant is performed in toluene.

In some embodiments, a method of manufacturing a semiconductor device includes the following steps. A photoresist layer is formed over a material layer on a substrate. The photoresist layer has a composition including a solvent and a first photo-active compound dissolved in the solvent. The first photo-active compound is represented by the following formula (A1) or formula (A2):

Formula (A1)

$Zr_{12}O_8(OH)_{14}(RCO_2)_{18}$; or

Formula (A2)

$Hf_6O_4(OH)_6(RCO_2)_{10}$.

R in the formula (A1) and R in the formula (A2) each include one of the following formulae (1) to (6):

Formula (1)

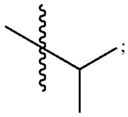

;

Formula (2)

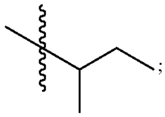

;

Formula (3)

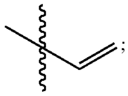

;

-continued

Formula (4)

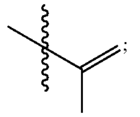

Formula (5)

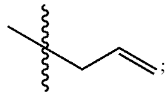

; or

Formula (6)

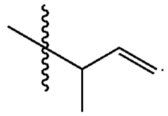

The photoresist layer is patterned. The material layer is etched using the photoresist layer as an etch mask. In some embodiments, the photoresist layer includes the following formula (A1-1):

Formula (A1-1)

$$Zr_{12}O_8(OH)_{14}(C_4H_9CO_2)_{18}.$$

In some embodiments, the photoresist layer includes the following formula (A2-1):

Formula (A2-1)

$$Hf_6O_4(OH)_6(C_4H_9CO_2)_{10}.$$

In some embodiments, the solvent includes 4-methyl-2-pentanol. In some embodiments, the photoresist layer further comprises a second photo-active compound dissolved in the solvent, the second photo-active compound includes the following formula (E1):

Formula (E1)

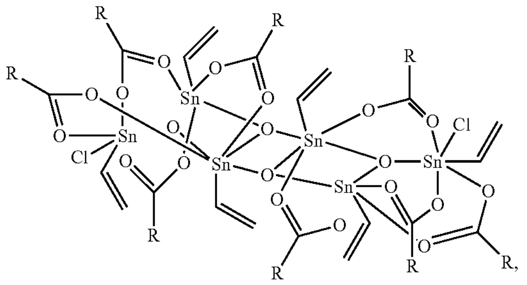

and R in the formula (E1) includes the formulae (1) to (6). In some embodiments, the photoresist layer further comprises a third photo-active compound dissolved in the solvent. The third photo-active compound includes the following formula (F1):

Formula (F1)

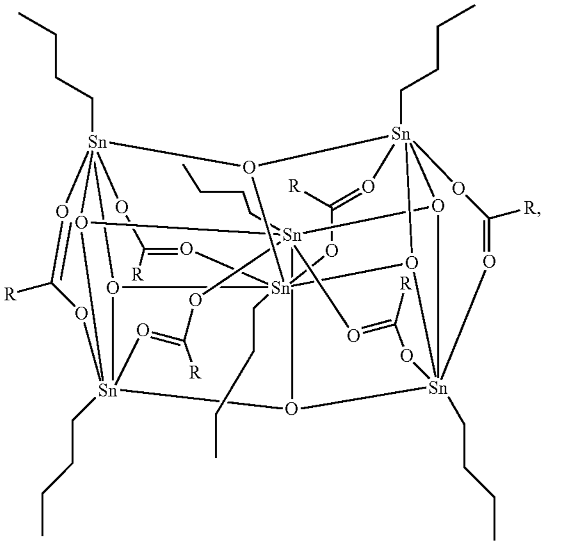

and R in the formula (F1) includes the formulae (1) to (6).

In some embodiments, a method of manufacturing a semiconductor device includes the In some embodiments, a method of forming a first photo-active compound includes the following steps. An $M(OBu)_4$ is reacted with at least one reactant having a carboxylic acid group to form a second photo-active compound. M is Hf or Zr. The second photo-active compound is decarboxylated to form the first photo-active compound. In some embodiments, decarboxylating the second photo-active compound is performed using a base comprising M'OH or $M'_2CO_3$, M' is Li, Na, K, Rb, Cs or $R_4N$, and R of $R_4N$ is an alkyl group having 1 to 4 carbon atoms. In some embodiments, the second photo-active compound includes the following formula (B1) or formula (B2):

Formula (B1)

$$Zr_{12}O_8(OH)_8(RCO_2)_{24}; \text{ or } \bullet 6RCO_2H$$

Formula (B2)

$$Hf_6O_4(OH)_4(RCO_2)_{12}H_2O, \bullet 3RCO_2H$$

and R in the formula (B1) and R in the formula (B2) each include the following formulae (1) to (6):

Formula (1)

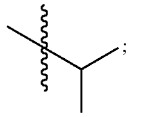

Formula (2)

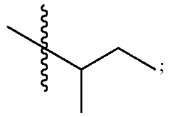

Formula (3)

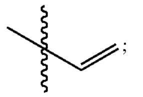

-continued

Formula (4)

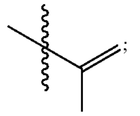

Formula (5)

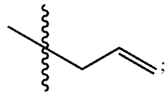

or

Formula (6)

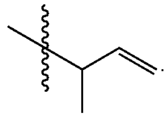

In some embodiments, the at least one reactant has a first compound and a second compound including the following formula (C1-a) and formula (C2-a), respectively:

Formula (C1-a)

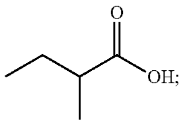

and

Formula (C2-a)

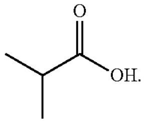

In some embodiments, the at least one reactant has a first compound and a second compound including the following formula (C1-b) and formula (C2-b), respectively:

Formula (C1-b)

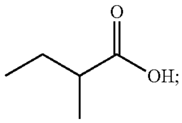

and

Formula (C2-b)

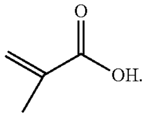

In some embodiments, the at least one reactant has a first compound and a second compound including the following formula (C1-c) and formula (C2-c), respectively:

Formula (C1-c)

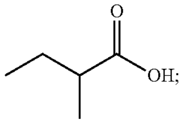

and

Formula (C2-c)\

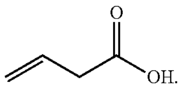

In some embodiments, the at least one reactant has a first compound and a second compound including the following formula (C1-d) and formula (C2-d), respectively:

Formula (C1-d)

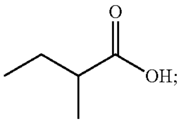

and

Formula (C2-d)

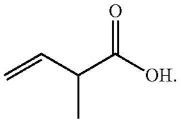

In some embodiments, the at least one reactant has a first compound and a second compound including the following formula (C1-e) and formula (C2-e), respectively:

Formula (C1-e)

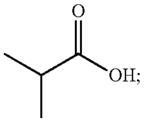

and

Formula (C2-e)

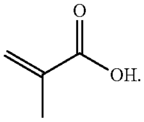

In some embodiments, the at least one reactant has a first compound and a second compound including the following formula (C1-f) and formula (C2-f), respectively:

Formula (C1-f)

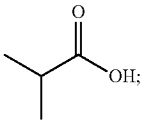

and

Formula (C2-f)

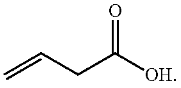

In some embodiments, the at least one reactant has a first compound and a second compound including the following formula (C1-g) and formula (C2-g), respectively:

Formula (C1-g)

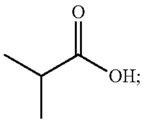

and

-continued

Formula (C2-g)

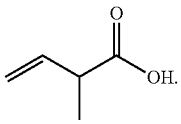

In some embodiments, reacting the $M(OBu)_4$ with the at least one reactant is performed in toluene.

In some embodiments, a method of manufacturing a semiconductor device includes the In some embodiments, a method of forming a first photo-active compound includes the following steps. An $M(OBu)_4$ is reacted with at least one reactant having a carboxylic acid group to form a second photo-active compound. M is Hf or Zr. The second photo-active compound is decarboxylated to form the first photo-active compound. In some embodiments, decarboxylating the second photo-active compound is performed using a base comprising M'OH or $M'_2CO_3$, M' is Li, Na, K, Rb, Cs or $R_4N$, and R of $R_4N$ is an alkyl group having 1 to 4 carbon atoms. In some embodiments, the second photo-active compound includes the following formula (B31) or formula (B2):

Formula (B1)

$Zr_{12}O_8(OH)_8(RCO_2)_{24}$; or $\cdot 6RCO_2H$

Formula (B2)

$Hf_6O_4(OH)_4(RCO_2)_{12}H_2O$, $\cdot 3RCO_2H$ and R in the formula (B1) and R in the formula (B2) each include the following formulae (1) to (6):

Formula (1)

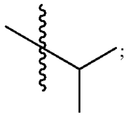

Formula (2)

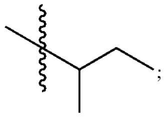

Formula (3)

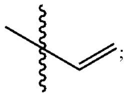

Formula (4)

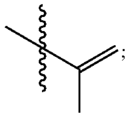

Formula (5)

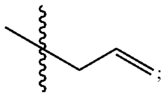

or

-continued

Formula (6)

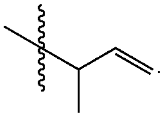

In some embodiments, the at least one reactant has a first compound and a second compound including the following formula (C1-a) and formula (C2-a), respectively:

Formula (C1-a)

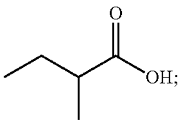

and

Formula (C2-a)

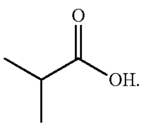

In some embodiments, the at least one reactant has a first compound and a second compound including the following formula (C1-b) and formula (C2-b), respectively:

Formula (C1-b)

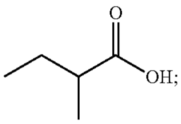

and

Formula (C2-b)

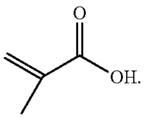

In some embodiments, the at least one reactant has a first compound and a second compound including the following formula (C1-c) and formula (C2-c), respectively:

Formula (C1-c)

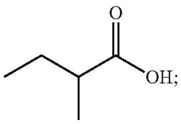

and

Formula (C2-c)

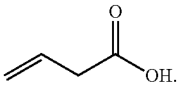

In some embodiments, the at least one reactant has a first compound and a second compound including the following formula (C1-d) and formula (C2-d), respectively:

Formula (C1-d)

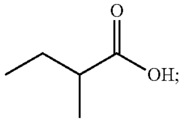

and

Formula (C2-d)

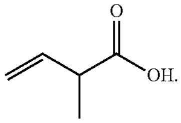

In some embodiments, the at least one reactant has a first compound and a second compound including the following formula (C1-e) and formula (C2-e), respectively:

Formula (C1-e)

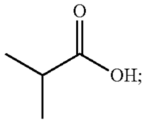

and

Formula (C2-e)

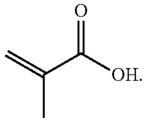

In some embodiments, the at least one reactant has a first compound and a second compound including the following formula (C1-f) and formula (C2-f), respectively:

Formula (C1-f)

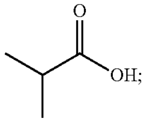

and

Formula (C2-f)

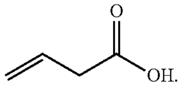

In some embodiments, the at least one reactant has a first compound and a second compound including the following formula (C1-g) and formula (C2-g), respectively:

Formula (C1-g)

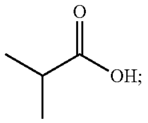

and

Formula (C2-g)

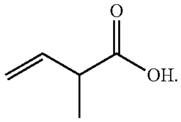

In some embodiments, reacting the $M(OBu)_4$ with the at least one reactant is performed in toluene.

In some embodiments, a method of manufacturing a semiconductor device includes the In some embodiments, a photoresist layer includes a solvent and a first photo-active compound. The first photo-active compound comprises a decarboxylated 6-Hf-oxo cluster, a decarboxylated 12-Zr-oxo cluster, or a combination thereof. In some embodiments, the photoresist layer further comprises an inorganic photo-active compound different from the first photo-active compound, an organic photo-active compound, or a combination thereof. In some embodiments, the inorganic photo-active compound includes the following formula (E1) or formula (F1):

Formula (E1)

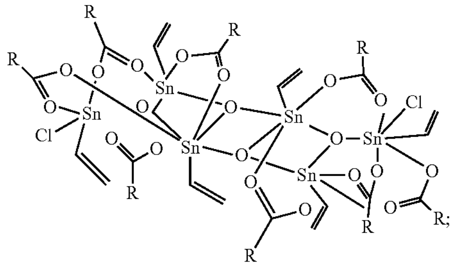

or

Formula (F1)

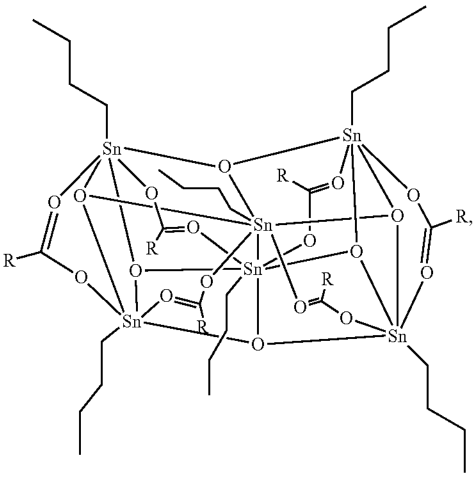

and R in the formula (E1) and formula (F1) each includes the following formulae (1) to (6):

Formula (1)

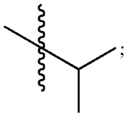

Formula (2)

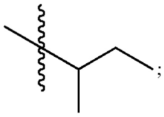

Formula (3)

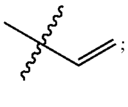

-continued

Formula (4)

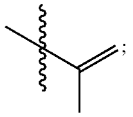

;

Formula (5)

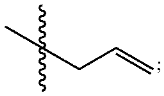

; or

Formula (6)

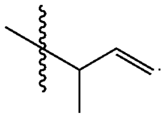

.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

depositing a first photoresist composition over a target layer to form a photoresist layer, wherein the first photoresist composition comprises:

a solvent; and a first photo-active compound dissolved in the solvent, wherein the first photo-active compound is represented by a formula (A3):

Formula (A3)

$$Hf_6O_4(OH)_8(RCO_2)_n(R'CO_2)_{8-n},$$

and each of R and R' in the formula (A3) include one of formulae (1) to (7):

Formula (1)

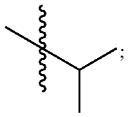

;

Formula (2)

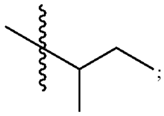

;

Formula (3)

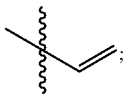

;

-continued

Formula (4)

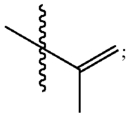

;

Formula (5)

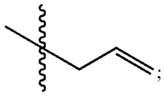

;

Formula (6)

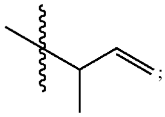

; or

Formula (7)

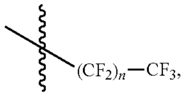

, wherein n in the formula (7) is 0 to 3;

patterning the photoresist layer; and etching the target layer using the photoresist layer as an etch mask.

2. The method of claim 1, wherein the first photo-active compound includes a formula (A3-1):

Formula (A3-1)

$$Hf_6O_4(OH)_8(C_4H_9CO_2)_8.$$

.

3. The method of claim 1, wherein the first photoresist composition further comprises a second photo-active compound dissolved in the solvent, and the second photo-active compound is a tin oxo cluster including 12 tin atoms.

4. The method of claim 1, wherein the first photoresist composition further comprises a second photo-active compound dissolved in the solvent, and the second photo-active compound is represented by a formula (H1):

Formula (H1)

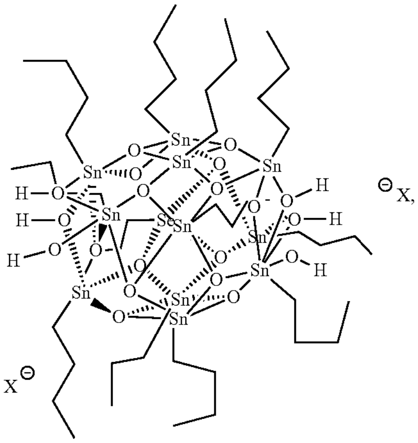

in which X in the formula (H1) is OH or $BF_4$.

5. The method of claim 1, wherein the first photoresist composition further comprises a second photo-active compound dissolved in the solvent, the second photo-active compound is represented by a formula (A2):

Formula (A2)

$Hf_6O_4(OH)_6(RCO_2)_{10}$, and R in the formula (A2) includes one of the formulae (1) to (7).

6. The method of claim 1, wherein after patterning the photoresist layer, the photoresist layer has a second photoresist composition, and the second photoresist composition is a mixture of $HfO_2$ and $HfO_{2-x}(RCO_2)_{2x}$, and R in the $HfO_{2-x}(RCO_2)_{2x}$ includes one of the formulae (1) to (7).

7. The method of claim 1, wherein patterning the photoresist layer comprises:

exposing the photoresist layer to an EUV radiation; and developing the photoresist layer.

8. The method of claim 1, wherein the first photoresist composition further comprises:

a second photo-active compound dissolved in the solvent, wherein the second photo-active compound has a composition different from a composition of the first photo-active compound.

9. The method of claim 8, wherein the second photo-active compound is represented by a formula with a number of OH group different from a number of OH group of the first photo-active compound.

10. The method of claim 9, wherein the number of OH group of the formula of the second photo-active compound is less than the number of OH group of the first photo-active compound.

11. A method of forming a first photo-active compound, comprising:

mixing a first compound and a solution in a container, wherein the first compound has a formula (A):

Formula (A)

$Hf_6O_4(OH)_4(RCO_2)_n(R'CO_2)_{12-n}H_2O$, $\bullet 3RCO_2H$ the R and R' in the formula (A) is represented by formulae (1) to (7):

Formula (1)

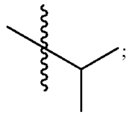

Formula (2)

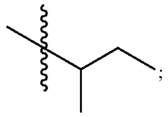

Formula (3)

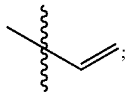

-continued

Formula (4)

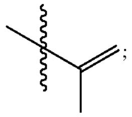

Formula (5)

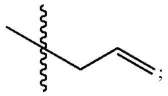

Formula (6)

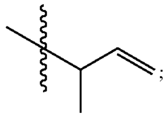

and

Formula (7)

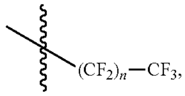

in which n is 0 to 3; and reacting the first compound in the solution using a hydrothermal method to form the first photo-active compound.

12. The method of claim 11, wherein the solution is a base.

13. The method of claim 11, wherein the solution is M'OH or $M'_2CO_3$, in which M' is Li, Na, K, Rb, Cs or $R_4N$, and R of $R_4N$ is an alkyl group having 1 to 4 carbon atoms.

14. A photoresist composition, comprising:

a solvent; and a first photo-active compound dissolved in the solvent, wherein the first photo-active compound comprises a formula (A1):

Formula (A1)

$Hf_6O_4(OH)_8(RCO_2)_n(R'CO_2)_{8-n}$, and wherein each of R and R' in the formula (A1) is (1) to (7):

Formula (1)

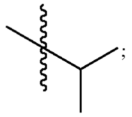

Formula (2)

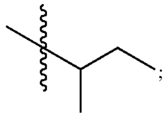

-continued

Formula (3)

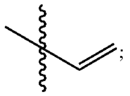

Formula (4)

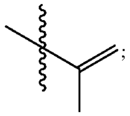

Formula (5)

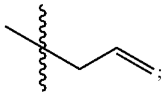

Formula (6)

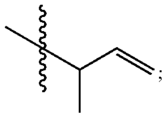

or

Formula (7)

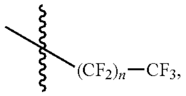

in which n is 0 to 3.

15. The photoresist composition of claim 14, further comprising:

a second photo-active compound dissolved in the solvent, and the second photo-active compound is a tin oxo cluster including 12 tin atoms.

16. The photoresist composition of claim 14, further comprising:

a second photo-active compound dissolved in the solvent, and the second photo-active compound is represented by a formula (H1):

Formula (H1)

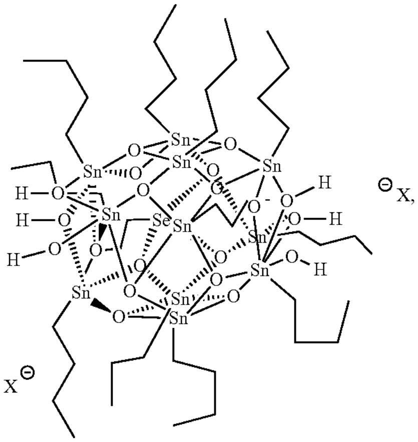

in which X in the formula (H1) is OH or $BF_4$.

17. The photoresist composition of claim 14, further comprising:

a second photo-active compound dissolved in the solvent, wherein the second photo-active compound has a composition different from a composition of the first photo-active compound.

18. The photoresist composition of claim 17, wherein the second photo-active compound is represented by a formula with a number of OH group, and the number of OH group is different from a number of OH group of the first photo-active compound.

19. The photoresist composition of claim 18, wherein the number of OH group of the formula of the second photo-active compound is less than the number of OH group of the first photo-active compound.

20. The photoresist composition of claim 14, further comprising:

a second photo-active compound dissolved in the solvent, wherein the second photo-active compound is represented by a formula (A2):

$Hf_6O_4(OH)_6(RCO_2)_{10}$ Formula (A2),

Formula (A2)

$Hf_6O_4(OH)_6(RCO_2)_{10}$, and R in the formula (A2) includes one of the formulae (1) to (7).

* * * * *